(12) United States Patent
Sabri et al.

(10) Patent No.: US 9,441,296 B2
(45) Date of Patent: Sep. 13, 2016

(54) HYBRID CERAMIC SHOWERHEAD

(75) Inventors: Mohamed Sabri, Beaverton, OR (US); Ramkishan Rao Lingampalli, Fremont, CA (US); Karl F. Leeser, West Linn, OR (US)

(73) Assignee: Novellus Systems, Inc., Fremont, CA (US)

( * ) Notice: Subject to any disclaimer, the term of this patent is extended or adjusted under 35 U.S.C. 154(b) by 1224 days.

(21) Appl. No.: 13/411,369

(22) Filed: Mar. 2, 2012

(65) Prior Publication Data

US 2012/0222815 A1 Sep. 6, 2012

Related U.S. Application Data

(60) Provisional application No. 61/449,537, filed on Mar. 4, 2011.

(51) Int. Cl.
*H01L 21/306* (2006.01)
*C23F 1/00* (2006.01)
*C23C 16/455* (2006.01)

(52) U.S. Cl.
CPC .............................. *C23C 16/45565* (2013.01)

(58) Field of Classification Search
CPC .............................................. C23C 16/45565
USPC .................................................. 156/345.34
See application file for complete search history.

(56) References Cited

U.S. PATENT DOCUMENTS

| | | |
|---|---|---|
| 3,215,508 A | 11/1965 | Piester |
| 4,577,203 A | 3/1986 | Kawamura |
| 4,890,780 A | 1/1990 | Mimata et al. |
| 5,232,508 A | 8/1993 | Arena et al. |
| 5,376,213 A | 12/1994 | Ueda et al. |
| 5,446,824 A | 8/1995 | Moslehi |
| 5,452,396 A | 9/1995 | Sopori |
| 5,653,479 A | 8/1997 | Henderson |
| 5,680,013 A * | 10/1997 | Dornfest .......... H01J 37/32559 118/723 E |

(Continued)

FOREIGN PATENT DOCUMENTS

| | | |
|---|---|---|
| CN | 1574229 A | 2/2005 |
| CN | 101290869 A | 10/2008 |

(Continued)

OTHER PUBLICATIONS

PCT International Search Report and Written Opinion in Application No. PCT/US2012/027596, dated Sep. 27, 2012.

(Continued)

*Primary Examiner* — Keath Chen
(74) *Attorney, Agent, or Firm* — Weaver Austin Villeneuve & Sampson LLP

(57) ABSTRACT

Various implementations of hybrid ceramic faceplates for substrate processing showerheads are provided. The hybrid ceramic showerhead faceplates may include an electrode embedded within the ceramic material of the faceplate, as well as a pattern of through-holes. The electrode may be fully encapsulated within the ceramic material with respect to the through-holes. In some implementations, a heater element may also be embedded within the hybrid ceramic showerhead faceplate. A DC voltage source may be electrically connected with the hybrid ceramic showerhead faceplate during use. The hybrid ceramic faceplates may be easily removable from the substrate processing showerheads for easy cleaning and faceplate replacement.

24 Claims, 26 Drawing Sheets

(56) References Cited

U.S. PATENT DOCUMENTS

| | | |
|---|---|---|
| 5,806,980 A | 9/1998 | Berrian |
| 5,834,068 A | 11/1998 | Chern et al. |
| 5,882,411 A | 3/1999 | Zhao et al. |
| 5,950,925 A | 9/1999 | Fukunaga et al. |
| 6,022,413 A | 2/2000 | Shinozaki et al. |
| 6,054,013 A | 4/2000 | Collins et al. |
| 6,112,697 A | 9/2000 | Sharan et al. |
| 6,140,215 A | 10/2000 | Foster et al. |
| 6,237,528 B1 | 5/2001 | Szapucki et al. |
| 6,245,192 B1 | 6/2001 | Dhindsa et al. |
| 6,289,842 B1 | 9/2001 | Tompa |
| 6,364,949 B1 | 4/2002 | Or et al. |
| 6,379,056 B1 | 4/2002 | Ueda |
| 6,453,992 B1 | 9/2002 | Kim |
| 6,460,482 B1 | 10/2002 | Kuibira et al. |
| 6,821,347 B2 | 11/2004 | Carpenter et al. |
| 6,883,733 B1 | 4/2005 | Lind |
| 6,921,556 B2 | 7/2005 | Shimizu et al. |
| 6,983,892 B2 | 1/2006 | Noorbakhsh et al. |
| 7,296,534 B2 | 11/2007 | Fink |
| 7,381,644 B1 | 6/2008 | Subramonium et al. |
| 7,712,434 B2 | 5/2010 | Dhindsa et al. |
| 7,820,556 B2 | 10/2010 | Hsu et al. |
| 7,883,632 B2* | 2/2011 | Honda ............... H01J 37/32091 204/192.1 |
| 7,955,990 B2 | 6/2011 | Henri et al. |
| 7,981,777 B1 | 7/2011 | Subramonium et al. |
| 7,981,810 B1 | 7/2011 | Subramonium et al. |
| 8,110,493 B1 | 2/2012 | Subramonium et al. |
| 8,137,467 B2 | 3/2012 | Meinhold et al. |
| 8,187,679 B2 | 5/2012 | Dickey et al. |
| 8,309,473 B2 | 11/2012 | Hsu et al. |
| 8,435,608 B1 | 5/2013 | Subramonium et al. |
| 8,443,756 B2 | 5/2013 | Fischer et al. |
| 8,673,080 B2 | 3/2014 | Meinhold et al. |
| 8,728,956 B2 | 5/2014 | LaVoie et al. |
| 9,034,142 B2 | 5/2015 | Bartlett et al. |
| 2001/0035127 A1 | 11/2001 | Metzner et al. |
| 2002/0144783 A1 | 10/2002 | Tran et al. |
| 2002/0162630 A1* | 11/2002 | Satoh ................ C23C 16/4583 156/345.51 |
| 2003/0070760 A1* | 4/2003 | Kim et al. ............... 156/345.43 |
| 2004/0050496 A1 | 3/2004 | Iwai et al. |
| 2004/0261712 A1* | 12/2004 | Hayashi ............ H01J 37/3244 118/723 E |
| 2005/0000423 A1 | 1/2005 | Kasai et al. |
| 2005/0000442 A1 | 1/2005 | Hayashi et al. |
| 2005/0017100 A1 | 1/2005 | Watanabe et al. |
| 2005/0103748 A1* | 5/2005 | Yamaguchi et al. ............ 216/67 |
| 2005/0173404 A1 | 8/2005 | Benjamin et al. |
| 2005/0241765 A1 | 11/2005 | Dhindsa et al. |
| 2005/0242061 A1 | 11/2005 | Fukuda |
| 2006/0042545 A1* | 3/2006 | Shibata et al. ................ 118/722 |
| 2006/0060138 A1* | 3/2006 | Keller ................ H01J 37/3244 118/715 |
| 2006/0137607 A1 | 6/2006 | Seo et al. |
| 2007/0246163 A1 | 10/2007 | Paterson et al. |
| 2007/0275569 A1 | 11/2007 | Moghadam et al. |
| 2008/0053614 A1 | 3/2008 | Sago et al. |
| 2008/0299326 A1* | 12/2008 | Fukazawa ............ C23C 16/458 427/569 |
| 2008/0317973 A1* | 12/2008 | White ................ C23C 16/45565 427/569 |
| 2009/0000743 A1 | 1/2009 | Iizuka |
| 2009/0095218 A1 | 4/2009 | Meinhold et al. |
| 2009/0095219 A1 | 4/2009 | Meinhold et al. |
| 2009/0095220 A1 | 4/2009 | Meinhold et al. |
| 2009/0095621 A1 | 4/2009 | Kao et al. |
| 2009/0260571 A1 | 10/2009 | Ostrowski et al. |
| 2010/0184298 A1 | 7/2010 | Dhindsa |
| 2010/0213162 A1 | 8/2010 | Mochiki et al. |
| 2011/0011338 A1 | 1/2011 | Chuc et al. |
| 2011/0052833 A1 | 3/2011 | Hanawa et al. |
| 2011/0146571 A1 | 6/2011 | Bartlett et al. |
| 2011/0256726 A1 | 10/2011 | LaVoie et al. |
| 2012/0031559 A1* | 2/2012 | Dhindsa ............ H01J 37/32091 156/345.26 |
| 2012/0070996 A1* | 3/2012 | Hao .................. H01L 21/68742 438/710 |
| 2013/0341433 A1 | 12/2013 | Roy et al. |
| 2014/0061324 A1 | 3/2014 | Mohn et al. |
| 2014/0158792 A1 | 6/2014 | Meinhold et al. |
| 2014/0179114 A1 | 6/2014 | van Schravendijk |
| 2014/0235069 A1 | 8/2014 | Breiling et al. |
| 2015/0007770 A1 | 1/2015 | Chandrasekharan et al. |
| 2015/0011096 A1 | 1/2015 | Chandrasekharan et al. |
| 2015/0218701 A1 | 8/2015 | Bartlett et al. |
| 2015/0315706 A1 | 11/2015 | Chandrasekharan et al. |

FOREIGN PATENT DOCUMENTS

| | | |
|---|---|---|
| CN | 101556904 A | 10/2009 |
| CN | 201343570 Y | 11/2009 |
| CN | 200820135478.5 | 11/2009 |
| CN | 102102194 A | 6/2011 |
| JP | 07-045542 | 2/1995 |
| JP | 2001-274103 A | 10/2001 |
| JP | 2005-123159 A | 5/2005 |
| JP | 2005-285846 A | 10/2005 |
| JP | 3147392 | 12/2008 |
| JP | 2010-033867 A | 2/2010 |
| KR | 20-0454281 | 6/2011 |
| SG | 152163 | 5/2011 |
| TW | 200610033 A | 3/2006 |
| TW | 200924049 A | 6/2009 |
| TW | M361710 | 7/2009 |
| TW | 201132793 | 10/2011 |
| WO | WO 00/42236 | 7/2000 |
| WO | WO 2005/103323 | 11/2005 |
| WO | WO 2006/022997 | 3/2006 |
| WO | WO 2012/122054 | 9/2012 |

OTHER PUBLICATIONS

PCT International Preliminary Report on Patentability in Application No. PCT/US2012/027596, dated Sep. 19, 2013.

U.S. Appl. No. 11/612,382, filed Dec. 18, 2006, Fang et al.

U.S. Appl. No. 11/849,208, filed Aug. 31, 2007, Subramonium et al.

Chapman, "Glow Discharge Processes: Sputtering and Plasma Etching," 5 pp., (John Wiley & Sons, 1980).

Coburn et al., "Postive-ion bombardment of substrates in rf diode glow discharge sputtering," 7 pp., Journal of Applied Physics 4965 (1972).

Koenig et al., "Application of RF Discharges to Sputtering," 4 pp., IBM Journal of Research Development 168 (1970).

Kohler et al., "Plasma potentials of 13.56-MHz rf argon glow discharges in a planar system," 8 pp., Journal of Applied Physics 57 (1985).

Maniv, "Modeling for rf discharge characteristics," 10 pp., Journal of Applied Physics 63 (1988).

U.S. Office Action, dated Sep. 17, 2010, issued in U.S. Appl. No. 11/974,966.

US Final Office Action, dated Mar. 21, 2011, issued in U.S. Appl. No. 11/974,966.

U.S. Office Action, dated Sep. 2, 2011, issued in U.S. Appl. No. 11/974,966.

U.S. Notice of Allowance, dated Jan. 6, 2012, issued in U.S. Appl. No. 11/974,966.

U.S. Office Action, dated Sep. 17, 2010, issued in U.S. Appl. No. 12/181,927.

U.S. Final Office Action, dated Mar. 28, 2011, issued in U.S. Appl. No. 12/181,927.

U.S. Examiner's Answer, dated Dec. 21, 2011, issued in U.S. Appl. No. 12/181,927.

U.S. Patent Board Decision on Appeal dated Aug. 19, 2013 issued in U.S. Appl. No. 12/181,927.

U.S. Notice of Allowance, dated Oct. 25, 2013, issued in U.S. Appl. No. 12/181,927.

U.S. Office Action, dated Sep. 17, 2010, issued in U.S. Appl. No. 11/974,945.

(56) References Cited

OTHER PUBLICATIONS

US Final Office Action, dated Mar. 21, 2011, issued in U.S. Appl. No. 11/974,945.
U.S. Office Action, dated Aug. 17, 2011, issued in U.S. Appl. No. 12/148,267.
U.S. Final Office Action, dated Jan. 30, 2012, issued in U.S. Appl. No. 12/148,267.
U.S. Office Action, dated Nov. 8, 2012, issued in U.S. Appl. No. 12/642,497.
U.S. Final Office Action, dated Apr. 8, 2013, issued in U.S. Appl. No. 12/642,497.
U.S. Office Action, dated Jul. 12, 2013, issued in U.S. Appl. No. 12/642,497.
U.S. Final Office Action, dated Nov. 6, 2013, issued in U.S. Appl. No. 12/642,497.
U.S. Office Action, dated Sep. 24, 2014, issued in U.S. Appl. No. 12/642,497.
U.S. Notice of Allowance, dated Jan. 15, 2015, issued in U.S. Appl. No. 12/642,497.
Chinese Office Action, dated May 12, 2009, issued in Application No. 200820135478.5.
Korean Office Action, dated Dec. 31, 2010, issued in Application No. 2008-0013796.
SG Search and Examination Report, dated May 3, 2010, issued in Application No. 2008/07575-6.
Chinese First Office Action, dated Feb. 8, 2014, issued in Application No. 201010602102.2.
Chinese Second Office Action, dated Aug. 29, 2014, issued in Application No. 201010602102.2.
SG Search and Examination Report, dated Mar. 5, 2012, issued in Application No. 201009408-4.
TW Office Action, dated Mar. 26, 2015, issued in Application No. 099144608.
Chinese First Office Action [no translation], dated Aug. 4, 2015, issued in Application No. 201280011733.4.
Novellus, XL*, High Vacuum Angle Valve, Air Operated, Lam Research, DOC-3076a, Document Control Released Oct. 25, 2012, 5 pages.
Lind et al., U.S. Appl. No. 14/716,823, "Corrosion Resistant Gas Distribution Manifold With Thermally Controlled Faceplate," filed May 19, 2015.
Chandrasekharan et al., U.S. Appl. No. 14/850,816, "Low Volume Showerhead With Faceplate Holes for Improved Flow Uniformity," filed Sep. 10, 2015.
Japanese Office Action, dated Sep. 15, 2015, issued in Application No. JP 2013-556661.
TW Office Action [no translation], dated Dec. 4, 2015, issued in Application No. TW 101107246.

\* cited by examiner

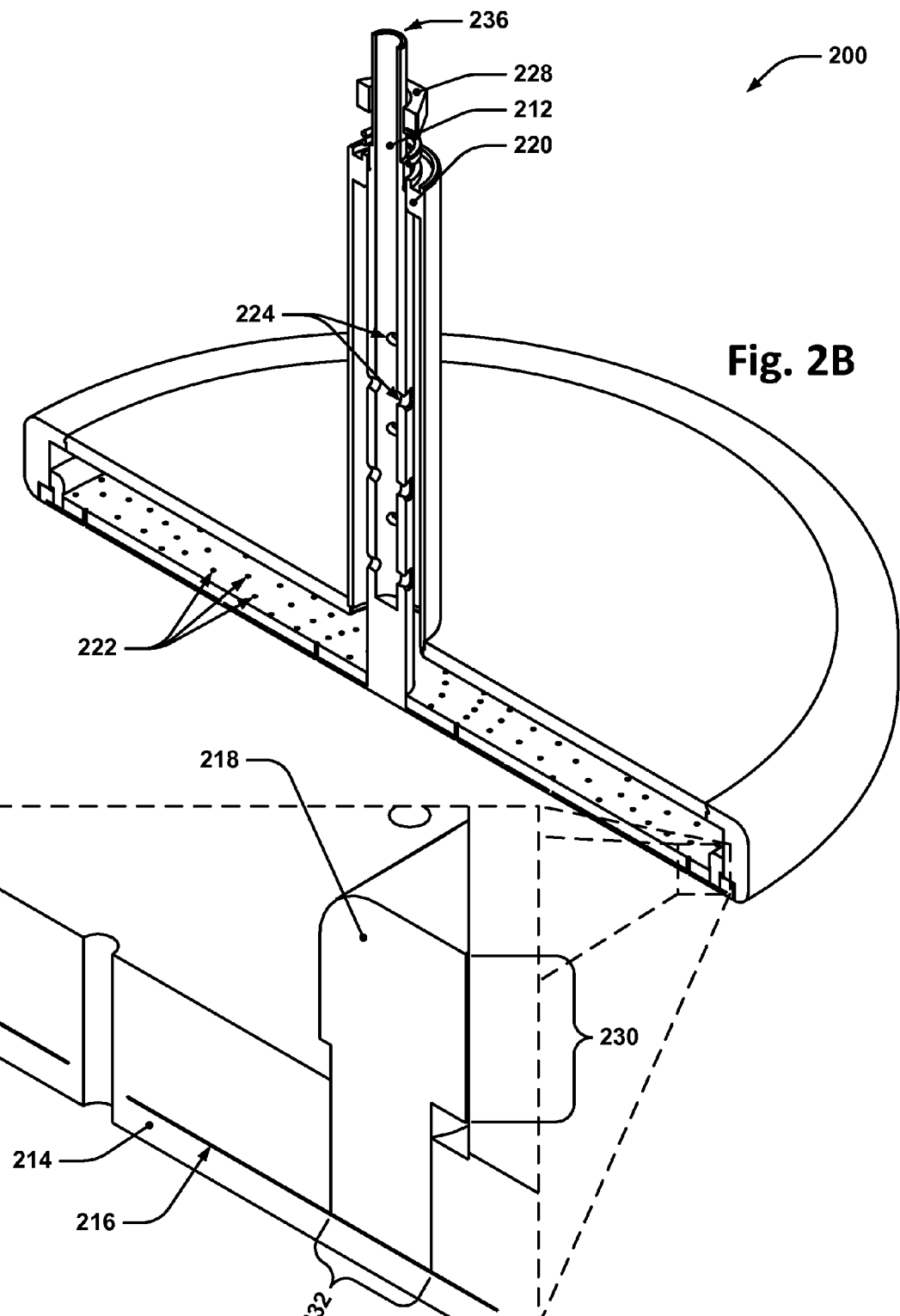

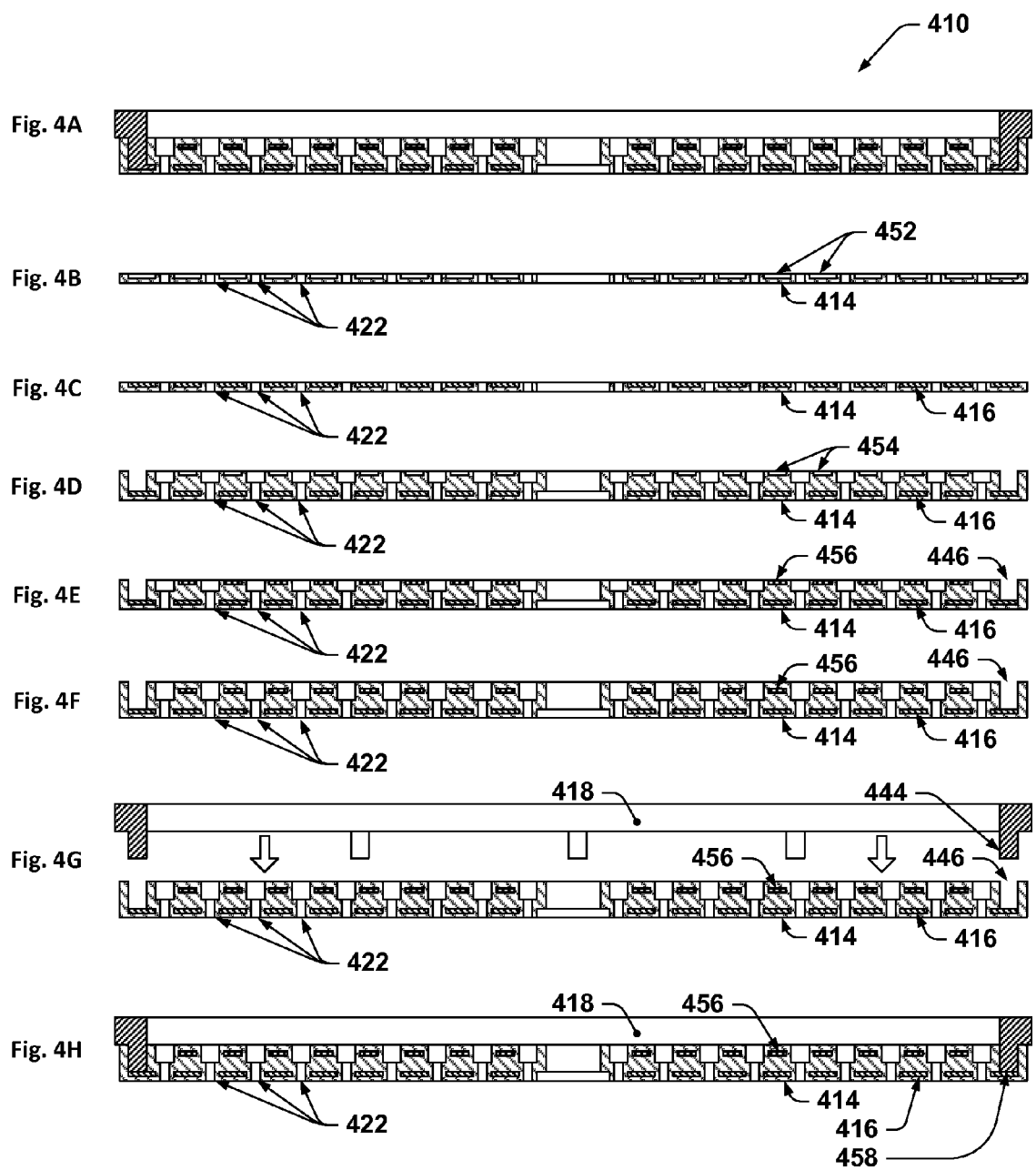

|  | Case #1 | Case #2 | Case #3 | Case #4 |
|---|---|---|---|---|
|  | Fig. 8A | Fig. 8B | Fig. 8C | |
| $e_Z$ | 0 | 0 | 0 | 20 |
| $e_P$ | 10 | 10 | -10 | 10 |
| $e_W$ | 7 | -70 | -90 | -70 |
| $e_P - e_W$ | 3 | 80 | 80 | 80 |

Fig. 8D

HYBRID CERAMIC SHOWERHEAD

CROSS-REFERENCE TO RELATED APPLICATIONS

This application claims benefit under 35 U.S.C. §119(e) to U.S. Provisional Patent Application No. 61/449,537, filed Mar. 4, 2011, which is herein incorporated by reference.

BACKGROUND OF THE INVENTION

Showerhead assemblies are often used in semiconductor fabrication modules to distribute process gases across the surface of a wafer or substrate during deposition, etching, or other processes.

Showerheads must often be replaced due to wear and tear, and the regular replacement of showerheads may be a substantial cost to a semiconductor manufacturer both in terms of replacement part cost and equipment downtime.

Some semiconductor fabrication methods decrease the lifespan of conventional showerheads, resulting in a need for more frequent replacement.

SUMMARY

A hybrid ceramic showerhead is disclosed which includes an embedded electrode. Various implementations of such a showerhead are described below and throughout this application. It is to be understood that the implementations discussed below are not to be viewed as limiting this disclosure to only the implementations shown. On the contrary, other implementations consonant with the principles and concepts outlined herein may also fall within the scope of this disclosure.

In some implementations, a gas distribution apparatus is provided. The gas distribution apparatus may include a ceramic faceplate for a substrate processing showerhead. The ceramic faceplate may include a first pattern of first through-holes configured to distribute semiconductor process gases across a substrate when the ceramic faceplate is installed in the substrate processing showerhead and the substrate processing showerhead is installed in a substrate processing apparatus. The ceramic faceplate may also include an electrode including a second pattern of second through-holes. The electrode may be embedded within the ceramic faceplate, the second pattern may match the first pattern, and each second through-hole may be larger in size than the corresponding first through-hole. In some further implementations, the ceramic faceplate may be configured to be removable from the substrate processing showerhead without requiring removal of the substrate processing showerhead from a substrate processing apparatus.

In some further implementations of the gas distribution apparatus, each second through-hole may have a diameter that is at least the larger of the diameter of the corresponding first through-hole plus 0.04" and twice the diameter of the corresponding first through-hole. In some further implementations of the gas distribution apparatus, the first through-holes may have diameters of between 0.02" to 0.06". In some further implementations of the gas distribution apparatus, the first through-holes may have diameters of approximately 0.05".

In some further implementations of the gas distribution apparatus, the electrode may be embedded within the ceramic faceplate at a depth of approximately 0.05" from a face of the ceramic faceplate which faces away from the substrate processing showerhead when the gas distribution apparatus is installed in the substrate processing showerhead. In some further implementations of the gas distribution apparatus, the electrode may be approximately 0.002" thick.

In some further implementations of the gas distribution apparatus, electrode may be fully encased by the ceramic material with the exception of one or more electrical contact patches located on a side of the electrically-conductive plate which faces towards the substrate processing showerhead when the gas distribution apparatus is installed in the substrate processing showerhead. In some further implementations of the gas distribution apparatus, the gas distribution apparatus may include one or more electrically-conductive pathways. The one or more electrically-conductive pathways may be in electrically-conductive contact with the one or more electrical contact patches, and at least a portion of the electrically-conductive pathways may be exposed to provide an electrically-conductive contact interface with an electrode power or ground source of the substrate processing showerhead.

In some further implementations of the gas distribution apparatus, the gas distribution apparatus may include a DC voltage source which may be electrically connected to the electrically-conductive contact interface. In some further implementations of the gas distribution apparatus, the DC voltage source may be configured to supply one or more DC voltages between 0 and 200 volts.

In some further implementations of the gas distribution apparatus, the gas distribution apparatus may include a contact ring and one or more standoffs. The contact ring and the one or more standoffs may be electrically-conductive, each of the one or more standoffs may be in electrically-conductive contact with a different contact patch of the one or more electrical contact patches of the electrode, and each standoff may be electrically connected with the contact ring via an electrically-conductive pathway. Additionally, the ceramic faceplate may include one or more blind standoff holes which each include an open end which faces away from the substrate when the ceramic faceplate is installed in the substrate processing showerhead. Each blind standoff hole may be terminated by the electrode, and each blind standoff hole may be configured to receive a corresponding standoff of the one or more standoffs.

In some further implementations of the gas distribution apparatus, the gas distribution apparatus may also include a backplate. The backplate may be configured to mechanically interface with the contact ring and with a gas distribution stem or stem sleeve of the substrate processing showerhead. The backplate may form an electrically-conductive pathway from the contact ring to the gas distribution stem or stem sleeve.

In some further implementations of the gas distribution apparatus, the ceramic faceplate may include a mechanical interface located near the center of the ceramic faceplate and which is configured to mate with a complementary mechanical interface of a gas distribution stem of the substrate processing showerhead. When the ceramic faceplate is installed in the substrate processing showerhead, the mechanical interface and the complementary mechanical interface may be mated together and the gas distribution stem, via the mated mechanical interface and complementary mechanical interface, may support the center of the ceramic faceplate.

In some further implementations of the gas distribution apparatus, the gas distribution apparatus may include the gas distribution stem and a gas distribution stem sleeve. The gas distribution stem may be mated with the gas distribution stem sleeve via a sliding interface, and the sliding interface may include a spring which constrains sliding movement of the gas distribution stem with respect to the gas distribution stem sleeve. The gas distribution stem sleeve and the ceramic faceplate may be substantially fixed in space relative to each other and with respect to movement along the sliding interface direction of travel, and the amount of support provided to the center of the ceramic faceplate may be governed by the displacement of the spring.

In some further implementations of the gas distribution apparatus, the contact ring may include interface features which are configured to rigidly connect the contact ring with the substrate processing showerhead, and the standoffs may support the contact ring with respect to the ceramic faceplate and vice-versa.

In some further implementations of the gas distribution apparatus, the interface features may be selected from the group consisting of a threaded interface formed about a circumference of the contact ring, a bayonet mount formed about the circumference of the contact ring, and a pattern of threaded fastener features spaced about the circumference of the contact ring.

In some further implementations of the gas distribution apparatus, the gas distribution apparatus may include an RF collar. The RF collar may be made of an electrically-conductive material and may include a thin-walled hoop of a larger diameter than the ceramic faceplate and a smaller diameter than an interior diameter of the contact ring. The RF collar may also include a plurality of inner collar tabs, each inner collar tab protruding from the thin-walled hoop towards the ceramic faceplate, overlapping with the ceramic faceplate, and substantially parallel to a plane normal to a central axis of the thin-walled hoop. The RF collar may also include a plurality of outer collar tabs, each outer collar tab protruding from the thin-walled hoop away from the ceramic faceplate, overlapping with the contact ring, and substantially parallel to the plane normal to the central axis of the thin-walled hoop.

In some further implementations of the gas distribution apparatus, the thin-walled hoop may be formed from one or more segments arranged end-to-end to form an overall hoop shape. In some further implementations of the gas distribution apparatus, each outer collar tab may be located approximately halfway between neighboring pairs of inner collar tabs about the RF collar's circumference. In some further implementations of the gas distribution apparatus, each inner collar tab may be located approximately halfway between neighboring pairs of outer collar tabs about the RF collar's circumference.

In some further implementations of the gas distribution apparatus, the gas distribution apparatus may include at least one heater element. The at least one heater element may be embedded within the ceramic faceplate, not be in electrical contact with the electrode, follow a path which does not intersect any of the first through-holes, and maintain a minimum distance from each first through-hole of at least the larger of 0.04" and the radius of the first through-hole.

In some further implementations of the gas distribution apparatus, the gas distribution apparatus may include a heater element embedded within a ceramic portion of the gas distribution apparatus. The heater element of this implementation may substantially encircle the first pattern of first through-holes and may be located in close proximity to an outermost nominal diameter of the substrate processing showerhead.

In some further implementations of the gas distribution apparatus, the gas distribution apparatus may include a ceramic backplate. The ceramic faceplate and the ceramic backplate may be joined by an annular ceramic wall with an outer diameter substantially the same as outer diameters of the ceramic faceplate and the ceramic backplate to form a unitary faceplate/backplate. A showerhead plenum volume may exist within the unitary faceplate/backplate, and the first through-holes may be in fluidic contact with the showerhead plenum volume. The ceramic backplate may include at least one mechanical interface feature located substantially about a first diameter, the first diameter substantially less than an outer diameter of the unitary faceplate/backplate, and configured to rigidly connect the unitary faceplate/backplate to a stem of the substrate processing showerhead.

In some further implementations of the gas distribution apparatus, the gas distribution apparatus may include an RF gasket and a seal. The at least one mechanical interface feature may include a threaded or bayonet mount located about a substantially circular port in the ceramic backplate. The seal may be located between an innermost diameter of the substantially circular port and an outermost diameter of the at least one mechanical interface feature, and the RF gasket may be located between an outermost diameter of the at least one mechanical interface feature and the seal.

In some further implementations of the gas distribution apparatus, the gas distribution apparatus may further include a plurality of screws and a seal. The at least one mechanical interface feature may include a hole pattern of threaded hole features, each hole feature configured to receive one of the screws. The threaded hole features may be located about a substantially circular port in the ceramic backplate, and the seal may be located between the hole pattern and an innermost diameter of the substantially circular port. In some further implementations of this implementation, the gas distribution apparatus may include an RF pin. The RF pin may be in electrically-conductive contact with the electrode, protrude from the ceramic faceplate and into the showerhead plenum volume, and of sufficient length to contact the stem in an electrically-conductive manner when the unitary faceplate/backplate is connected to the stem via the at least one mechanical interface feature.

In some further implementations of the gas distribution apparatus, the gas distribution apparatus may further include a baffle plate. The baffle plate may be located within the showerhead plenum volume, spaced off of the ceramic backplate and is substantially centered with respect to the ceramic backplate, and have an outermost diameter larger than an inner diameter of the stem.

In some implementations, a substrate processing apparatus is provided. The substrate processing apparatus may include a process chamber, a gas distribution apparatus as described above and throughout this document, and a pedestal. The gas distribution apparatus and the pedestal may be located substantially within the process chamber.

In some further implementations of the substrate processing apparatus, the electrode of the gas distribution apparatus may be electrically connected with a DC voltage source and to a ground impedance, and a pedestal electrode in the pedestal may be electrically connected with an RF power source.

In some further implementations of the substrate processing apparatus, the substrate processing apparatus may include a gas distribution stem with a first end and a second end. The first end may be opposite the second end on the gas distribution stem and connected with a top of the process chamber. The second end of the gas distribution stem may be connected to the gas distribution apparatus. The gas distribution apparatus may be removable from the gas distribution stem without removing the gas distribution stem from the top of the process chamber.

Details of one or more implementations of the subject matter described in this specification are set forth in the accompanying drawings and the description below. Other features, aspects, and advantages will become apparent from the description, the drawings, and the claims.

BRIEF DESCRIPTION OF THE DRAWINGS

FIG. 2B depicts an isometric cutaway view of a hybrid ceramic showerhead with an inset detail view.

FIG. 2B' depicts the inset detail view of FIG. 2B.

FIG. 2F' depicts the inset detail view of FIG. 2F.

FIGS. 4A through 4J depict various stages of a manufacturing process which may be used to create components described herein.

FIG. 8D shows a table summarizing various voltage conditions from FIGS. 8A through 8C.

FIGS. 2A through 3D' and 5A through 5G are to-scale drawings, although the exact scale used from FIG. to FIG. may differ. These drawings are intended to convey several different ways of implementing the techniques and apparatuses disclosed herein, and should not be interpreted as limiting the disclosed material to only those implementations shown.

DETAILED DESCRIPTION OF THE INVENTION

Figure 1:
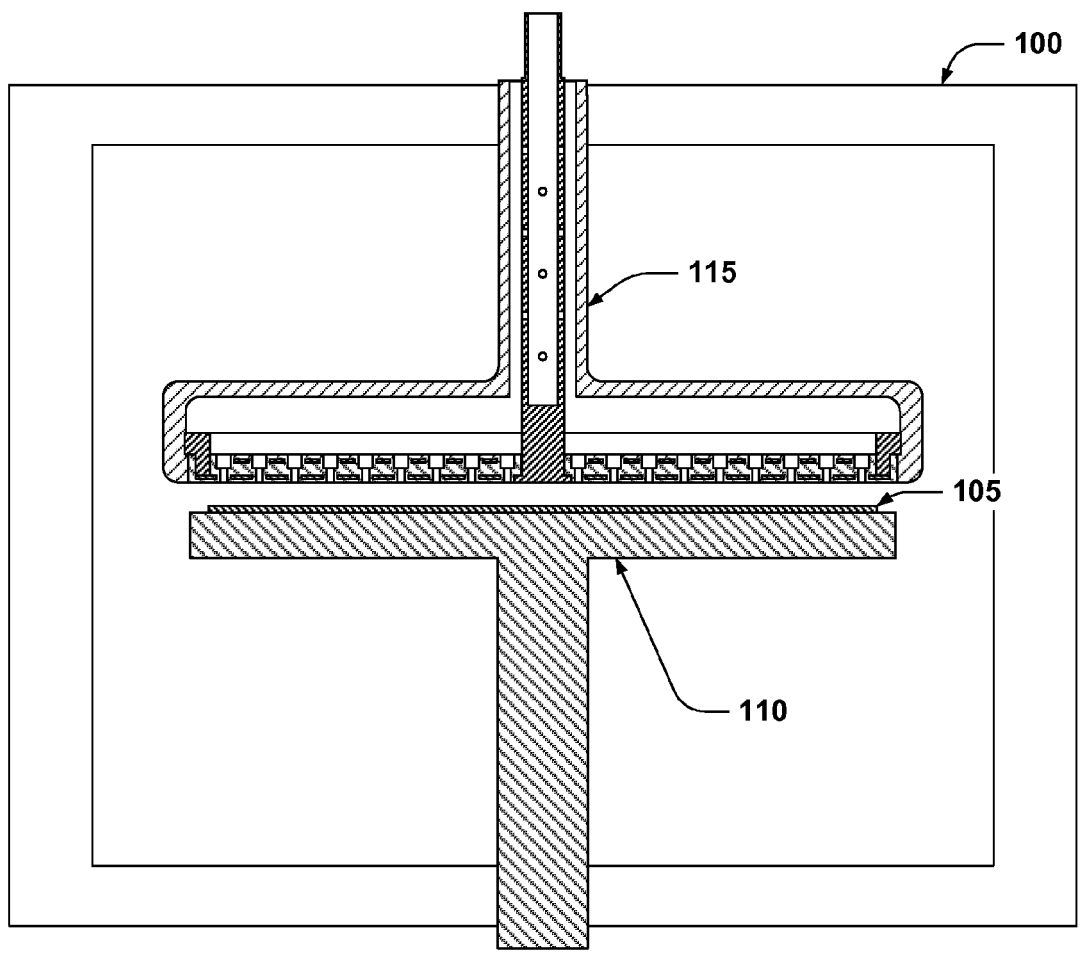
FIG. 1 depicts a high-level cutaway view of a semiconductor process chamber.

Reference will now be made in detail to specific implementations of the invention. Examples of the specific implementations are illustrated in the accompanying drawings. While the invention will be described in conjunction with these specific implementations, it will be understood that it is not intended to limit the invention to such specific implementations. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well-known process operations have not been described in detail in order not to unnecessarily obscure the present invention.

Hard masks are used as etch stop layers in semiconductor processing. Ashable hard masks (AHM) have a chemical composition that allows them to be removed by a technique referred to as ashing once they have served their purpose. An ashable hard mask is generally composed of carbon & hydrogen with trace amounts of one or more dopants (e.g., nitrogen, fluorine, boron, silicon). The bonding structure in these hard masks can vary from sp2 (graphite-like) to sp3 (diamond-like) or a combination of both, depending on the deposition conditions.

In a typical application, after etching the hard mask has served its purpose and must be removed from the underlying dielectric oxide (e.g., $SiO_2$). This is generally accomplished, at least in part, by ashing, also referred to as "plasma ashing" or "dry stripping." Substrates with hard masks to be ashed, generally partially fabricated semiconductor wafers, are placed into a chamber under vacuum, and oxygen is introduced and subjected to radio frequency power which creates oxygen radicals (plasma). The radicals react with the hard mask to oxidize it to water, carbon monoxide, and carbon dioxide. In some instances, complete removal of the hard mask may be accomplished by following the ashing with additional wet or dry etching processes, for example when the ashable hard mask leaves behind any residue that cannot be removed by ashing alone.

AHM processes often involve the generation of high temperatures in the vicinity of the wafers being processed, i.e., 500-650° C. The melting point of aluminum alloys which are commonly used in semiconductor fabrication tooling, such as 6000-series aluminum alloys, is often in the 645-660° C. range and may therefore be unsuitable for use in components exposed to such AHM processing temperatures.

AHM processes are described in further detail in U.S. patent application Ser. Nos. 11/318,269, 12/048,967, 11/449, 983, 11/612,382, 11/710,377, 11/849,208, 12/163,670, 12/334,220, 12/133,223, and 12/786,842, all of which are incorporated by reference.

Showerheads configured in accordance with the implementations discussed in this application provide enhanced performance in high-temperature semiconductor fabrication processes such as AHM processes and easier cleaning and maintenance.

AHM, as well as other semiconductor fabrication processes, is typically performed within a reactor, also commonly referred to as a process chamber or reactor chamber. The reactor may provide a controlled environment during wafer processing and may include various mechanical and electrical systems used during wafer processing. A high-level overview of one implementation of a reactor is shown in FIG. 1. A reactor 100 may receive a wafer 105 on a pedestal 110, which may include a chuck to prevent the wafer 105 from movement or misalignment during processing operations. The pedestal 110 may be raised or lowered by a drive actuator to facilitate loading or unloading of the wafer 105 from the pedestal 110 or to establish optimal spacing between the wafer 105 and the showerhead 115. Process gases may be distributed across the surface of the wafer 105 by the showerhead 115, which is fed by a gas inlet 120. Gas within the reactor 100 may be evacuated through the use of a vacuum pump or source.

The reactor shown in FIG. 1 is simply one implementation of a reactor which may be used in semiconductor fabrication processes. Additional components may be added as necessary, and some components may not be necessary in all cases. Additionally, the structures shown may vary considerably from one reactor design to the next, e.g., the showerhead 115 is shown as a "chandelier" type showerhead, but may alternatively be a "flush-mount" showerhead. The present disclosure should not be interpreted as being limited to only the depicted and discussed implementations, but is generally applicable to semiconductor fabrication processes and tools of all types.

Semiconductor fabrication often requires that process gases, such as deposition and etch gases, be flowed in a uniform or controlled manner over a semiconductor wafer or substrate undergoing processing. To that end, a "showerhead" gas flow manifold, sometimes also referred to as a gas distributor, may be used to distribute process gases across the surface of a wafer. Process gases may be flowed out of the showerhead and distributed across a wafer; the wafer may be supported by a pedestal assembly within a process chamber housing the showerhead. Distribution of the process gases across the wafer may be accomplished through a pattern of gas distribution holes which direct the flow of gas from inside the showerhead to the wafer.

Many showerheads are limited lifetime components (LLC) and may require regular replacement (limited life component exchange, or LLCE) due to degradation of the showerhead arising from various process steps, e.g., deposition or etch operations which gradually alter the geometry and performance of a showerhead. The number of wafers which may be processed by a showerhead before LLCE may vary, typically ranging, for example, between 65,000 to 100,000 wafers, although some showerheads may be used to process up to 600,000 wafers before an LLCE. A showerhead may also undergo periodic cleaning cycles in between wafer processing operations; such cycles may occur, for example, every 25 to 100 wafer processing cycles. The lifetime of a showerhead may be dependent on many factors, including the types of environments it is exposed to during processing, the frequency of any cleaning operations, and the process quality requirements of the semiconductor manufacturer.

LLCE of a showerhead may be necessary due to a number of factors, including undesired particulates collecting within the showerhead plenum, surface variations forming in the wafer-facing surfaces of the showerhead which affect plasma formation, dimensional variations in the gas distribution holes located in the showerhead faceplate, and other factors affecting process controllability and yield.

Due to the more severe thermal environments which may be encountered during AHM processing than in other types of semiconductor fabrication, the number of wafers which may be processed using conventional showerheads in AHM processes may be much lower, for example, between 10,000 and 20,000. This may result in more frequent showerhead replacement, which may result in increased component cost and lost manufacturing opportunities while the LLCE is occurring. A hybrid ceramic (HC) showerhead featuring an RF electrode embedded within a ceramic showerhead faceplate may provide a longer-lived showerhead solution in the AHM context, as well as in other semiconductor processes which inflict similarly harsh environmental conditions on showerhead equipment.

FIGS. 2A through 2F depict various views of one implementation of a HC showerhead 200. The HC showerhead 200, as shown in the isometric section views of FIGS. 2A and 2B, may include a backplate 202, a ceramic faceplate assembly 210, and a gas distribution stem 212. The backplate 202 may be connected with the stem sleeve 220. The ceramic faceplate assembly 210 may include a ceramic faceplate 214, an embedded ground/power plane 216, also known as an electrode, and a contact ring 218. The gas distribution stem 212 may span between stem sleeve 220 and ceramic faceplate assembly 210. The gas distribution stem 212 may be omitted or significantly shortened for implementations of the HC showerhead 200 which are "flush-mount" showerheads.

During various wafer processing stages, a plasma environment may be generated within the process chamber in which wafer processing takes place. The HC showerhead 200 may thus be exposed to, and/or used to create, the plasma environment. For example, in one configuration, the HC showerhead 200, or components therein, may be used as an RF power source used for sparking a plasma. A pedestal or other structure within the processing chamber may be used as an RF ground in such situations. In other configurations, the HC showerhead 200, or components therein, may be used as the RF ground and the pedestal or other structures within the process chamber may be used to supply RF power for plasma generation.

Plasmas may be used to activate various process gases in the vicinity of the wafer being processed. To prevent premature activation of the process gases, i.e., prior to distribution of the process gases by the HC showerhead 200 over the wafer surface, the HC showerhead 200 may shield the process gases against stray RF energy which might induce a plasma within the volume of the HC showerhead 200 itself. The HC showerhead 200 may be constructed such that a Faraday cage is formed around the interior volume of HC showerhead 200. Through the implementation of the Faraday cage, the chance of RF energy from plasma processing within the process chamber arcing within the interior volume of the HC showerhead 200 may be eliminated or greatly reduced. Prevention of premature activation of the process gases within the interior volume of the HC showerhead 200 may reduce the amount of chemical interaction between the process gases and the interior walls of the HC showerhead 200.

In the implementation depicted in FIGS. 2A-2F, a Faraday cage may be formed within the HC showerhead 200 through the use of electrically-conductive materials in the ground/power plane 216, the contact ring 218, the backplate 202, and the stem sleeve 220. These structures may be configured to form a continuous electrically-conductive path which shields the interior of the HC showerhead 200 from stray RF energy. Perforations in the Faraday cage for distributing gas, such as gas distribution holes 222, may be sized such that RF leakage through the perforations is minimized or eliminated.

Figure 2A:
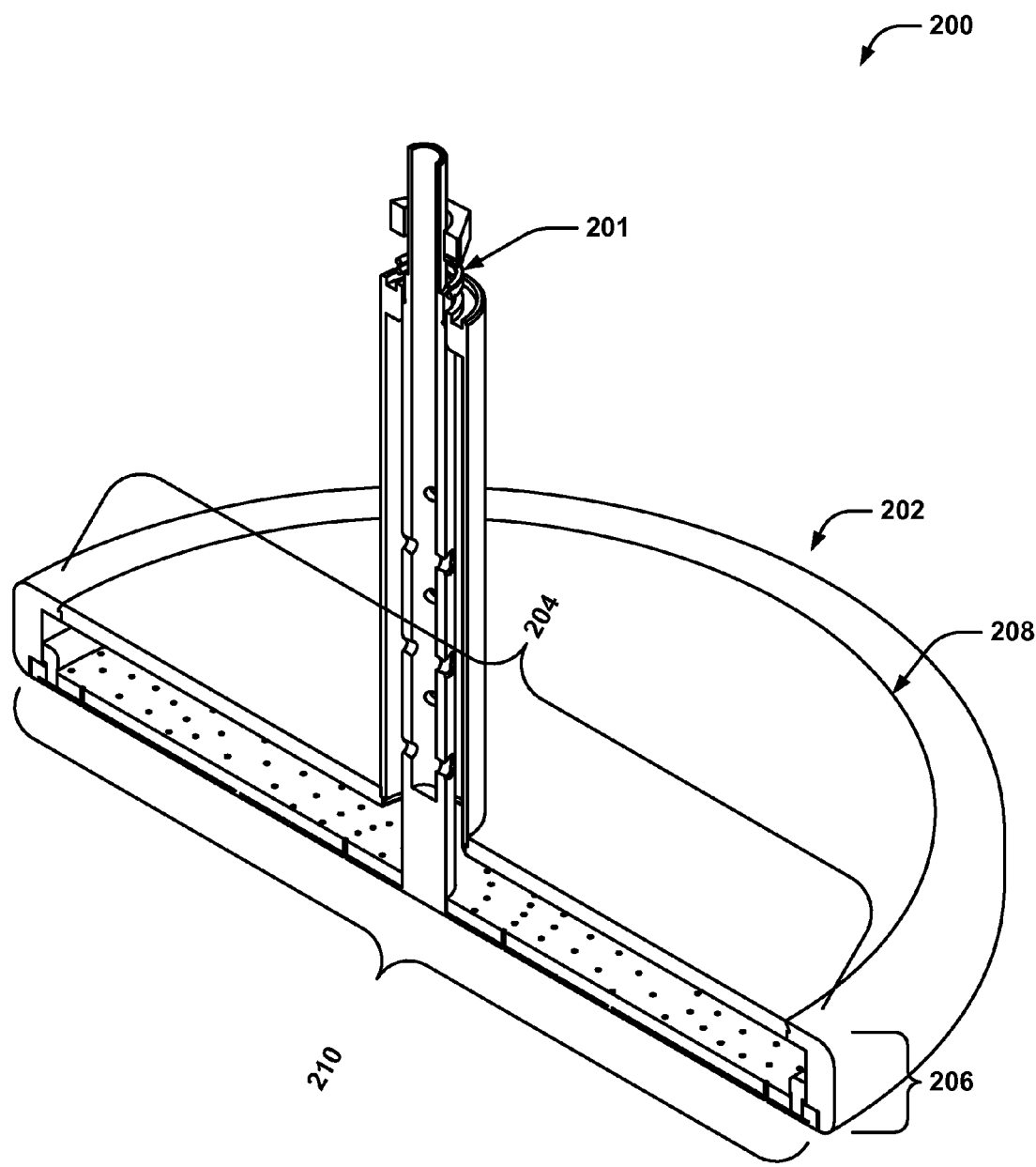
FIG. 2A depicts an isometric cutaway view of a hybrid ceramic showerhead.
Figure 2C:
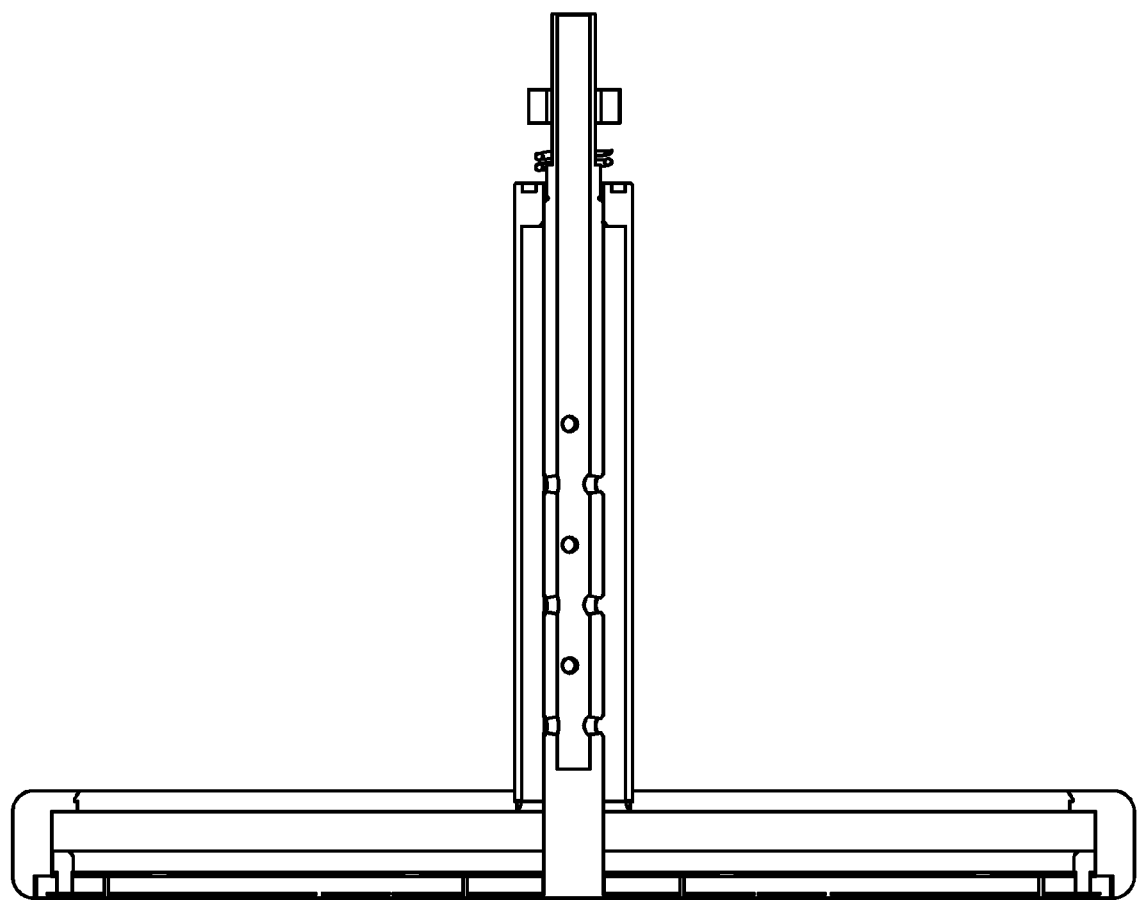
FIG. 2C depicts a side cutaway view of a hybrid ceramic showerhead.
Figure 2D:
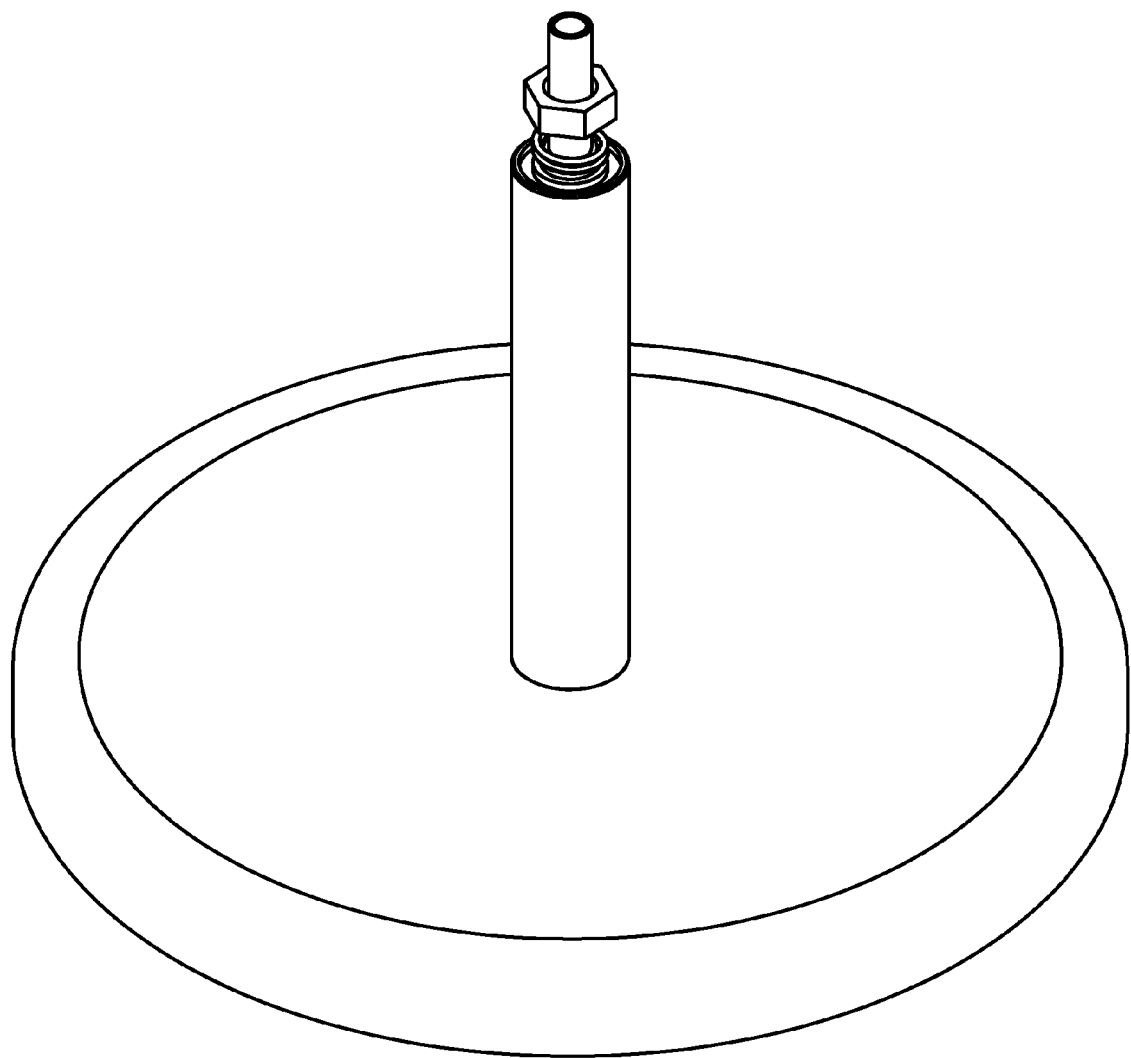
FIG. 2D depicts an isometric view of a hybrid ceramic showerhead.
Figure 3A:
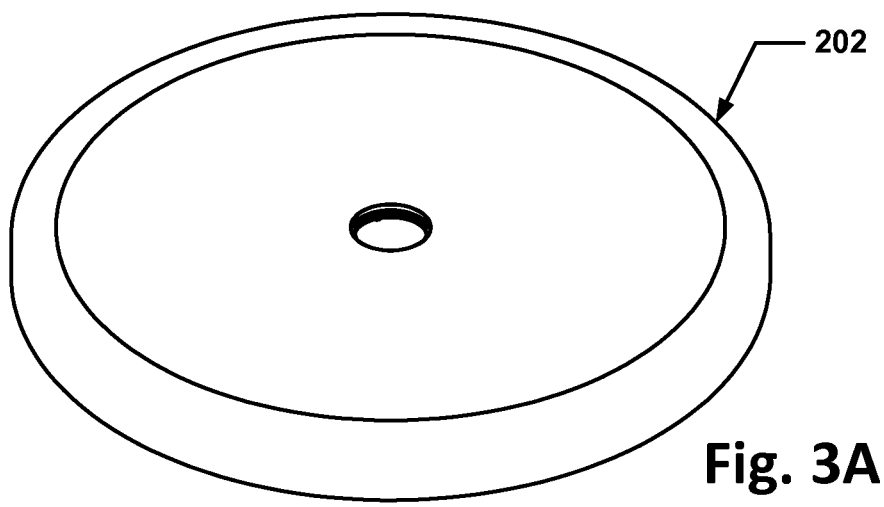
FIGS. 3A and 3A' depict two isometric views of a backplate.
Figure 3A:
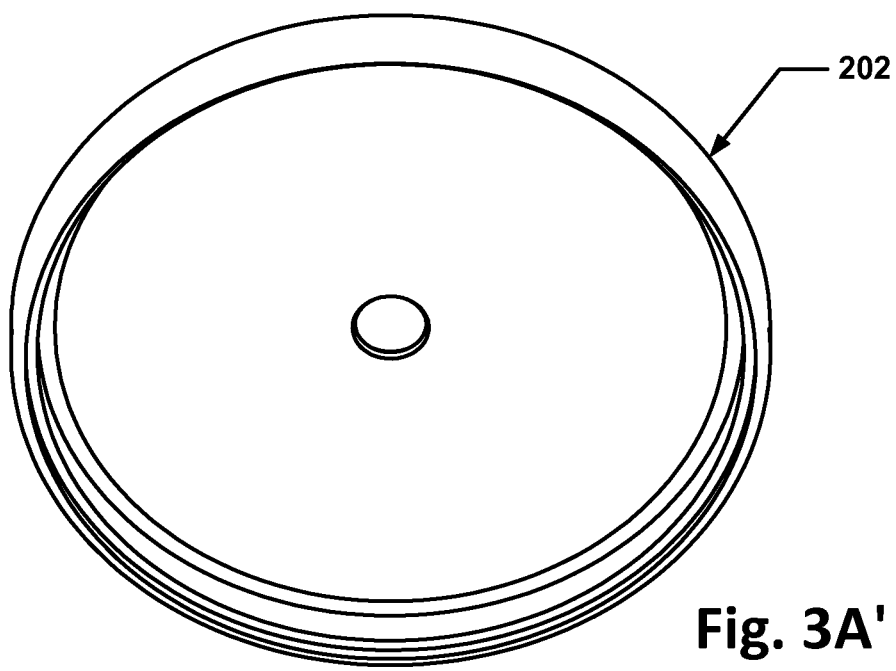

Referring to FIG. 2A, the backplate 202 is a substantially radially symmetric part including disk-like back wall 204 which transitions to a cylindrical wall 206 at the periphery of the back wall. While the terms "disk-like" and "cylindrical wall" are used to describe the overall shapes of these features, these terms are also intended to include structures which are substantially similar, such as, for example, back walls and cylindrical walls which are slightly tapered or conical, as well as various types of transition surfaces between such structures, such as chamfers and fillets/rounds. While FIG. 2A shows the separate back wall 204 and the cylindrical wall 206 which are welded together at weld seam 208 to form the backplate 202, the backplate 202 may be manufactured as a single, integrated part or may be manufactured from more than two pieces. For example, the backplate 202 may be machined from a solid blank of aluminum. FIGS. 3A and 3A' depict two isometric views of the backplate 202. Weld seam 208 would not be present in non-welded backplate structures.

Figure 3B:
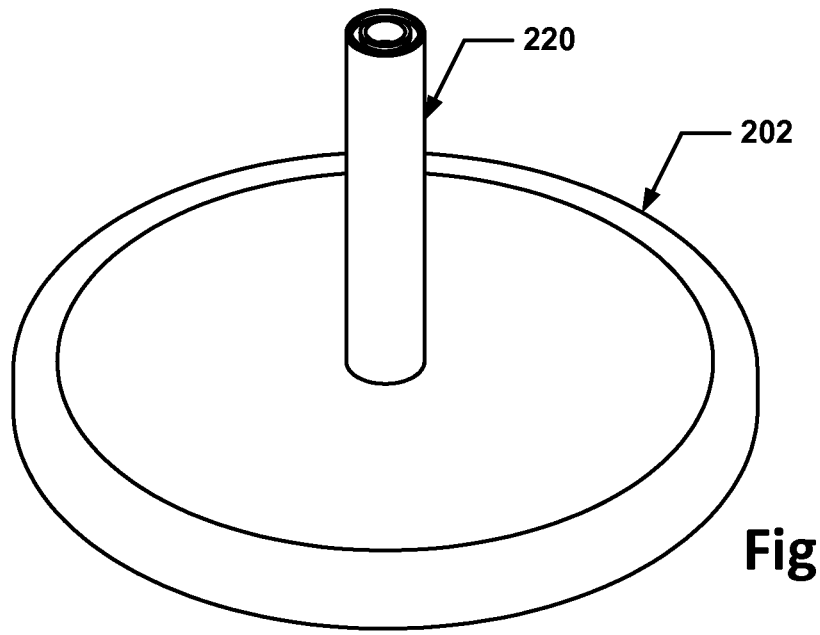
FIGS. 3B and 3B' depict two isometric views of a backplate with a stem sleeve attached.
Figure 3B:
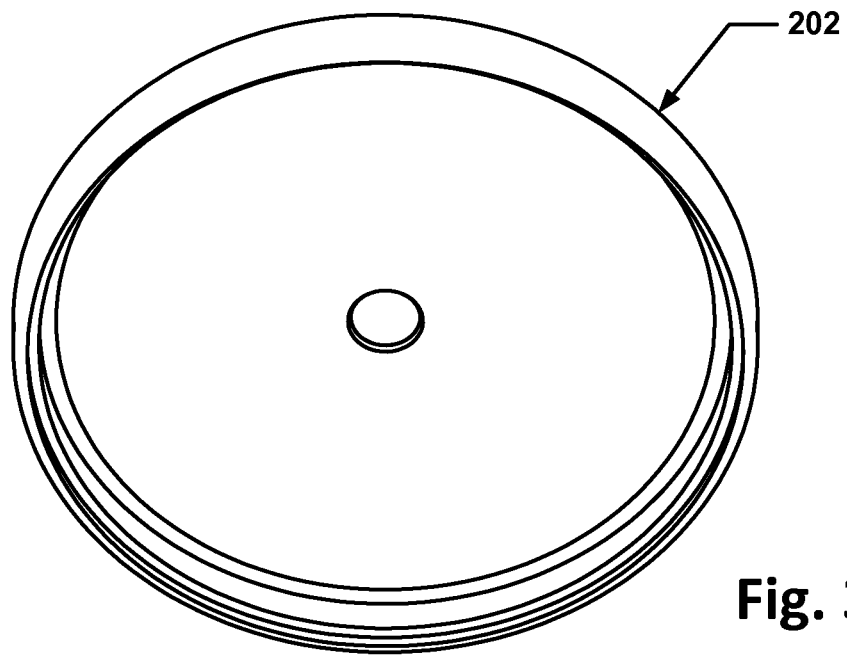

Referring to FIG. 2B, the back wall 204 of the backplate 202 may include a hole in the central area of the back wall 204. The hole may be sized to allow the gas distribution stem 212 to be inserted therethrough while preserving an annular gas flow gap between the outer surface of the gas distribution stem 212 and the inner edge of the hole. The hole may also be sized to allow for mounting of the stem sleeve 220 to the backplate 202, as shown in FIG. 2B. The hole may include a step or other features to facilitate mounting of the stem sleeve 220 to the backplate 202. The stem sleeve 220 may be welded, brazed, diffusion-bonded, or otherwise fused to the backplate 202. Other configurations are contemplated as well, such as variants in which there is no gas distribution stem 212 and gas is simply introduced into the stem sleeve 220. FIGS. 3B and 3B' depict two isometric views of the backplate 202 and the stem sleeve 220.

The stem sleeve 220 may be substantially cylindrical in shape. The stem sleeve 220 may include a gas distribution region with a first internal diameter, and a gas distribution stem interface region with a second internal diameter. The first internal diameter may be sized to create an annular gas flow gap between the outer surface of the gas distribution stem 212 and an inner surface of the stem sleeve 220; the first internal diameter may be approximately the same diameter as the diameter of the hole in the back wall of the backplate 202. The second internal diameter may be sized to allow for sliding engagement between the gas distribution stem 212 and the gas distribution region of the stem sleeve 220.

The backplate 202 and the stem sleeve 220 may be manufactured from aluminum, although other conductive materials may be used as well. Aluminum is particularly well-suited to this application because it is easy to machine, relatively inexpensive, and builds up passivating aluminum fluoride ($AlF_3$) layers when exposed to fluorine rather than suffering material erosion.

Figure 2E:
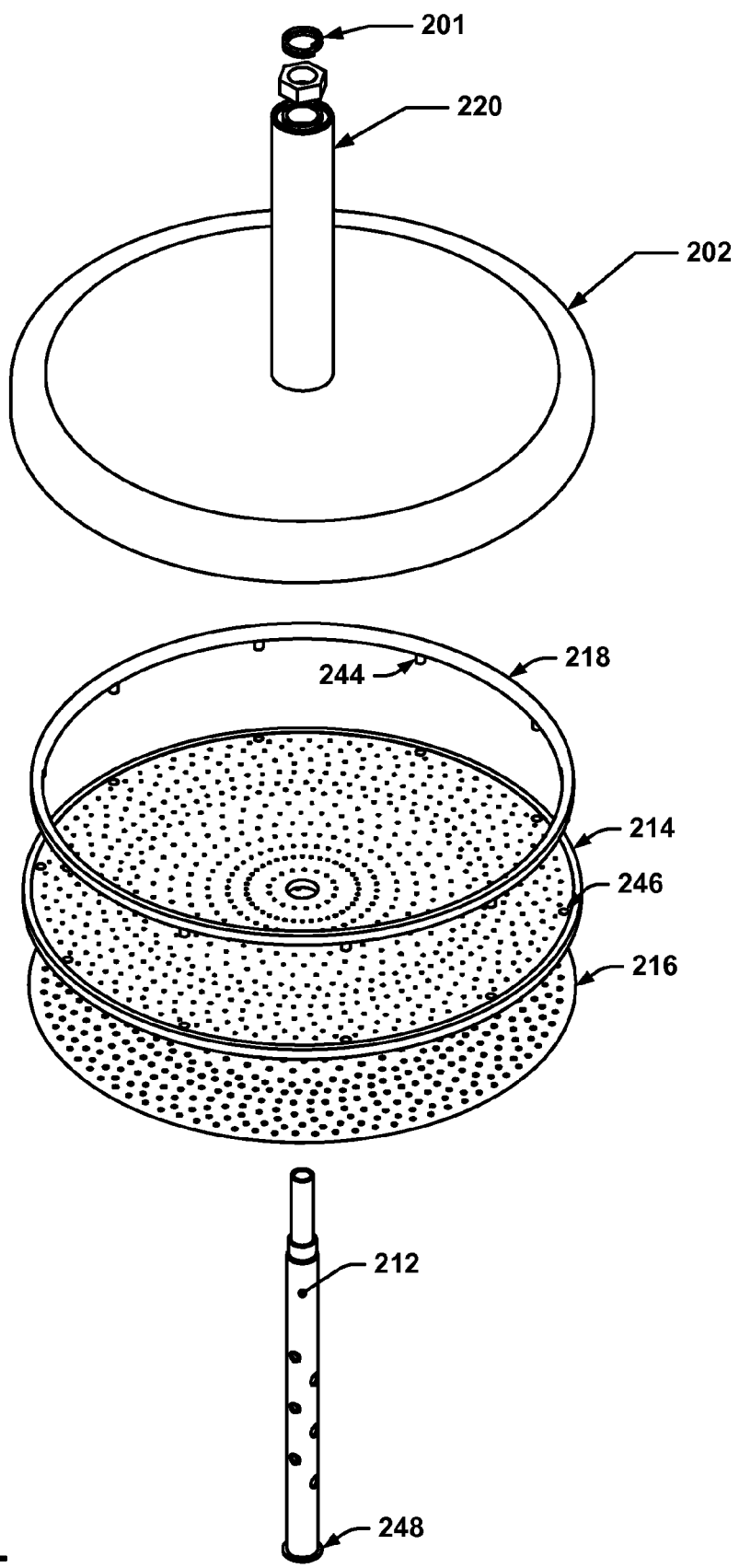
FIG. 2E depicts the hybrid ceramic showerhead shown in FIG. 2D but using an exploded view.

In the implementation shown in FIGS. 2A through 2F, the ceramic faceplate assembly 210 is a substantially annular disk. As noted above, the ceramic faceplate assembly 210 may include the ceramic faceplate 214, the ground/power plane 216, and the contact ring 218. The ground/power plane 216 may be embedded within the ceramic faceplate 214. FIG. 2E shows an exploded view of the HC showerhead 200 which may be referenced for additional detail. FIGS. 3C and 3C' depict two isometric views of the ceramic faceplate assembly 210.

As shown in FIGS. 2B, 2B', and 2E, standoff posts 244 on the contact ring 218 may pass through the ceramic faceplate 214 via standoff blind holes 246 in the ceramic faceplate 214 and may be in electrical contact with the ground/power plane 216 via contact patches 232. The ground/power plane 216 may be fused to the standoffs 244 at the contact patches 232 using diffusion bonding or brazing, for example. Other equivalent fusion techniques which establish an electrically-conductive joint may also be used. The standoffs 244 on the contact ring 218 may be manufactured separately from the contact ring 218 and later joined to the contact ring 218. For example, the contact ring 218 may include one or more hole features designed to each receive a standoff post 244 which is then affixed to contact ring 218. The connection of the standoff posts 244 to the contact ring 218 may be permanent, e.g., fusion bonding or brazing, or reversible, e.g., threaded attachment or screws. The contact ring 218 and the standoffs 244 may provide an electrically-conductive pathway or pathways for an RF power source or a ground source to reach the electrode from the gas distribution stem 212 and/or the stem sleeve 220. An electrically-conductive contact interface, such as a threaded, conductive feature, an RF gasket, or a contact pin, may be used to provide for electrical conductivity between the electrically-conductive pathway or pathways and the gas distribution stem 212 and/or the stem sleeve 220.

The contact ring 218 has a substantially rectangular cross-section in FIGS. 2A through 2F, although other cross-sections may be used as well. In addition to the surface from which the standoff posts 244 protrude, the contact ring 218 may also include an outer surface 230 which may be configured with interface features designed to mechanically and electrically connect the ceramic faceplate assembly 210 to the backplate 202. For example, the outer surface of the contact ring 218 may be threaded, and the corresponding interior surface of the backplate 202 may include matching threaded features allowing for threaded engagement between the two parts. Other types of mechanical and electrical connections may be used as well; for example, bayonet-type connections or screws may be used.

Both the ground/power plane 216 and the ceramic faceplate 214 may include a pattern of small gas distribution holes 222. In one implementation, approximately 3000 gas distribution holes may be distributed across the ground/power plane 216 and the ceramic faceplate 214; the hole patterns on both parts may be designed to align, although the hole diameters of the gas distribution holes in the ground/power plane 216 may be of a larger diameter than the corresponding gas distribution holes 222 in the ceramic faceplate 214.

Figure 2F:
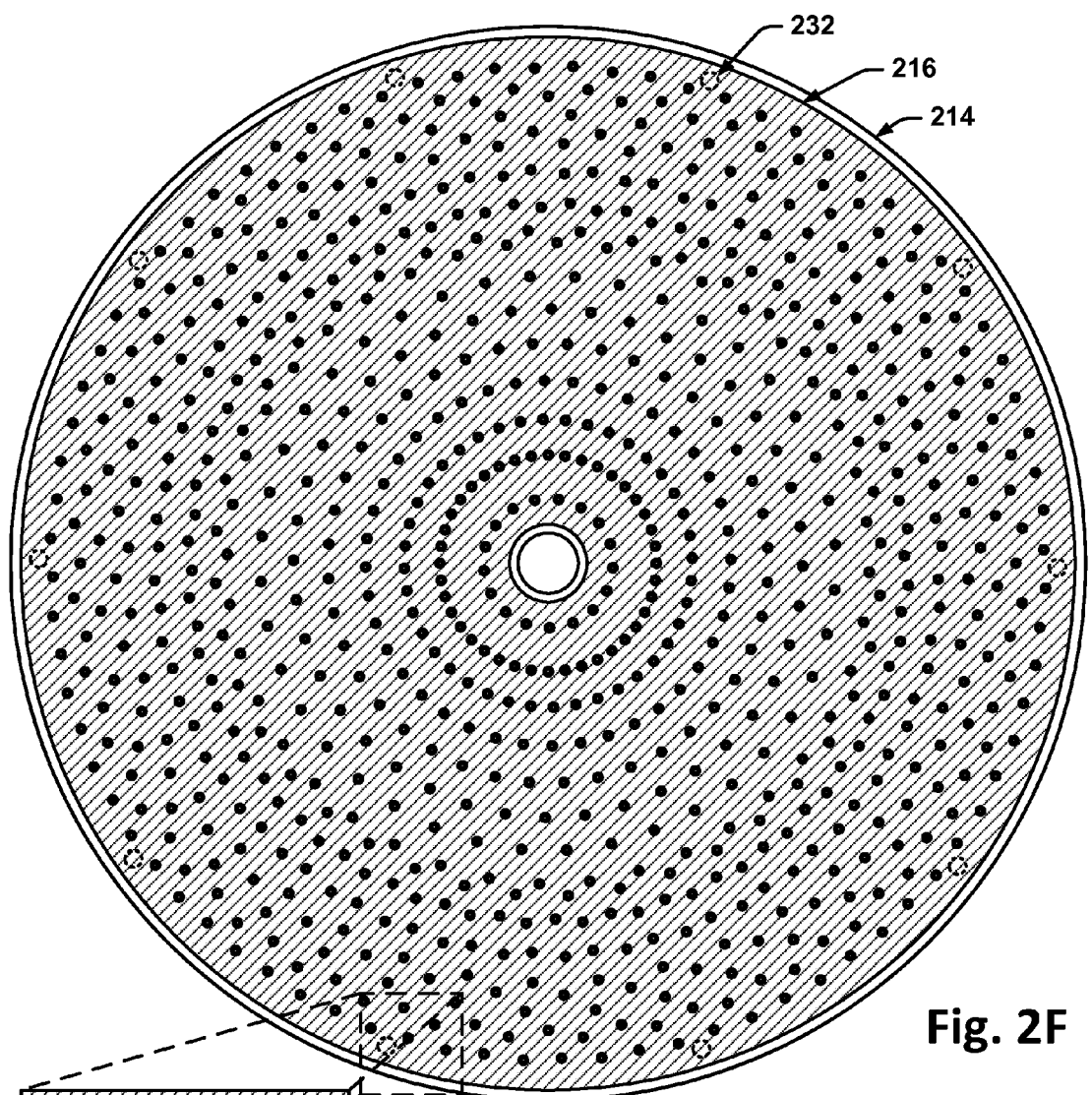
FIG. 2F depicts a section view of a ceramic faceplate and ground/power plane with an inset detail view.
Figure 2F:
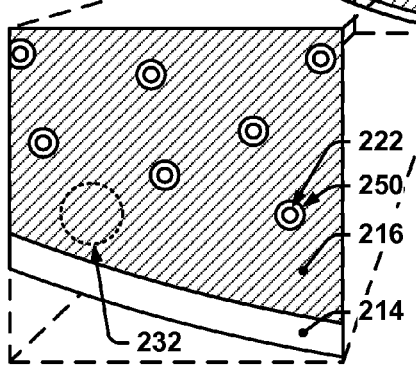
Figure 3C:
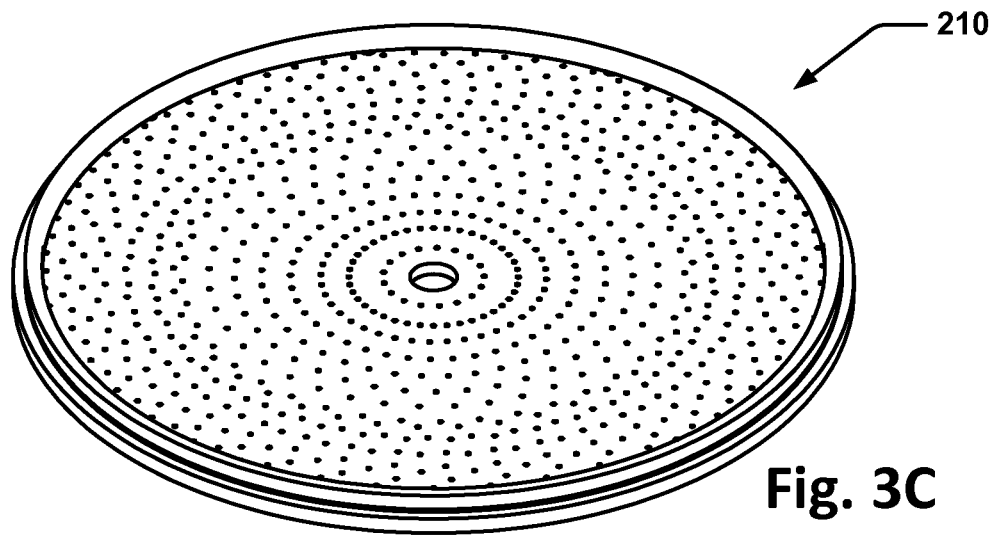
FIGS. 3C and 3C' depict two isometric views of a ceramic faceplate assembly.
Figure 3C:
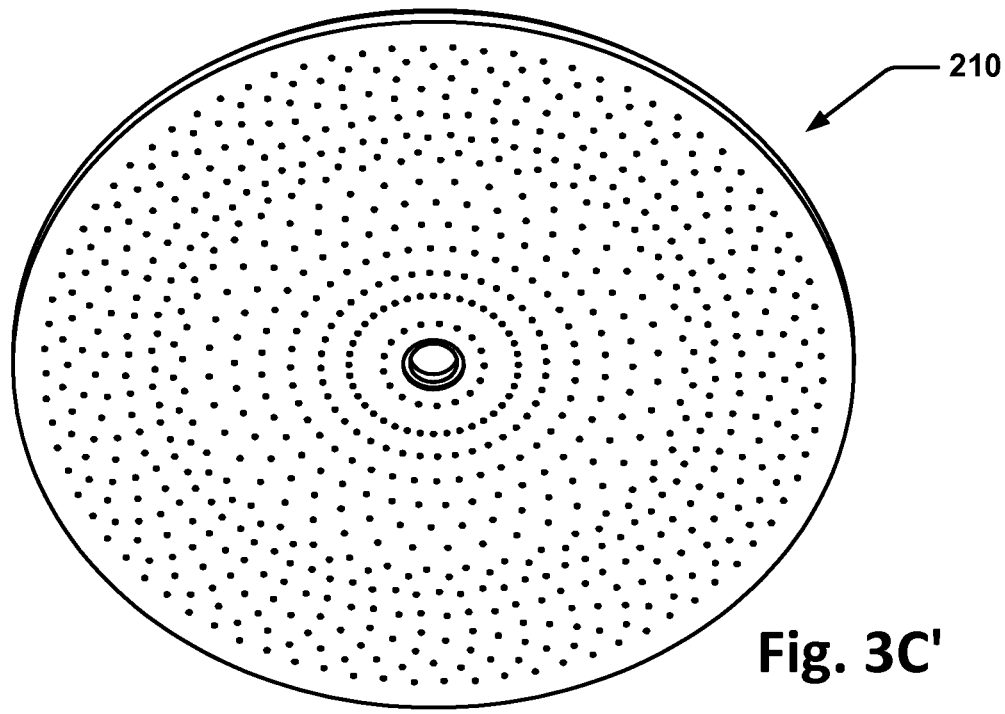

FIG. 2F shows a cutaway view of the ceramic faceplate assembly 210; the section plane is parallel to the overall plane of, and intersects with, the ground/power plane 216. Shading is used to indicate the ground/power plane 216; the ceramic faceplate 214 is not shaded. Inset 2F' depicts a close-up view of a portion of the ceramic faceplate assembly 210. As can be seen, the ground/power plane 216 may feature holes 250 which are a larger diameter than the gas distribution holes 222. This may allow the ground/power plane 216 to be fully encapsulated by the ceramic faceplate 214, aside from the contact patches 232, which are shown as dashed circles.

In one implementation, the gas distribution holes 222 in ceramic faceplate 214 may be 0.050" in diameter, whereas the corresponding holes 250 in the ground/power plane 216 may be 0.100" in diameter. Other gas distribution hole sizes may be used as well, e.g., sizes falling in the range of 0.02" to 0.06" in diameter. As a general rule, the holes 250 in the ground/power plane 216 may be 100% or more larger in diameter than the corresponding gas distribution holes 222 in the ceramic faceplate 214, although the holes 250 in the ground/power plane 216 should be at least 0.04" larger in diameter than the gas distribution holes 222 in the ceramic faceplate 214.

The gas distribution holes 222 may be arranged in any of several different configurations, including grid arrays, polar arrays, spirals, offset spirals, hexagonal arrays, etc. The hole arrangements may result in varying hole density across the showerhead. Different diameters of gas distribution holes may be used in different locations depending on the gas flow desired. In the implementation pictured in FIG. 2F, the gas distribution holes 222 are all of the same nominal diameter and patterned using hole circles of different diameters and with different numbers of holes.

The gas distribution holes 222 may also vary in diameter through the thickness of the ceramic faceplate 214. For example, the gas distribution holes 222 may be a first diameter on the face of the ceramic faceplate 214 facing the backplate 202 and may be a second diameter when the gas distribution holes 222 exit the opposite side of the ceramic faceplate 214. The first diameter may be larger than the second diameter. Regardless of the potential for varying gas distribution hole sizes, the holes 250 in ground/power plane 216 may be sized relative to the diameter of the gas distribution holes 222 in the ceramic faceplate 214 as measured in the same plane as the ground/power plane 216.

In some implementations, a heater element may be embedded in the ceramic faceplate 214 in addition to the ground/power plane 216. The heater element may not be in electrical contact with the ground/power plane 216 and may be insulated from the ground/power plane 216 by intervening ceramic material from the ceramic faceplate 214.

The heater may be powered through a controlled closed loop heater controller using 100 VAC to 240 VAC. The heater controller may be programmed to a pre-determined temperature set point; the temperature may be reported to the heater controller through a temperature sensor, such as a thermo-couple, and the power may be turned off and on to maintain the set point.

FIGS. 3A and 3A' show an isometric view and an off-angle backside view, respectively, of the backplate 202. FIGS. 3B and 3B' show views corresponding with those in FIGS. 3A and 3A', but with the stem sleeve 220 attached. FIGS. 3C and 3C' depict an isometric view and an off-angle backside view, respectively, of the ceramic faceplate assembly 210.

Figure 3D:
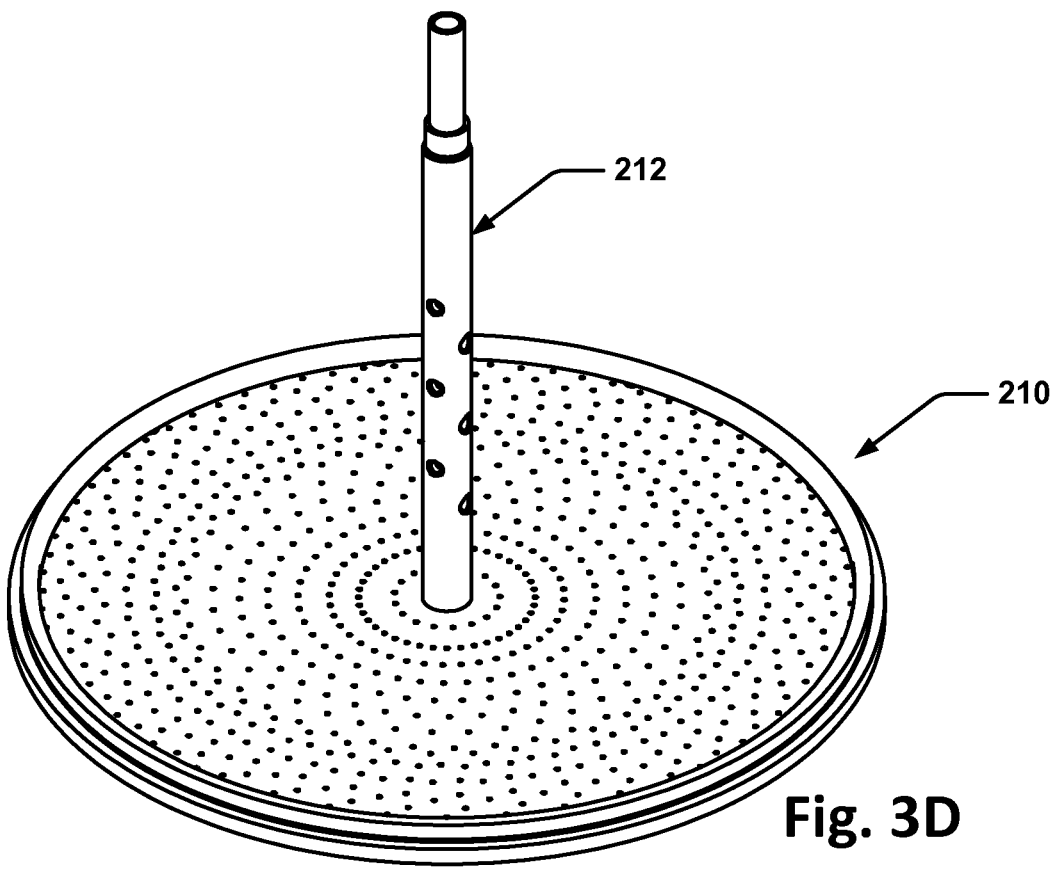
FIGS. 3D and 3D' depict two isometric views of a ceramic faceplate assembly with a gas distribution stem attached.
Figure 3D:
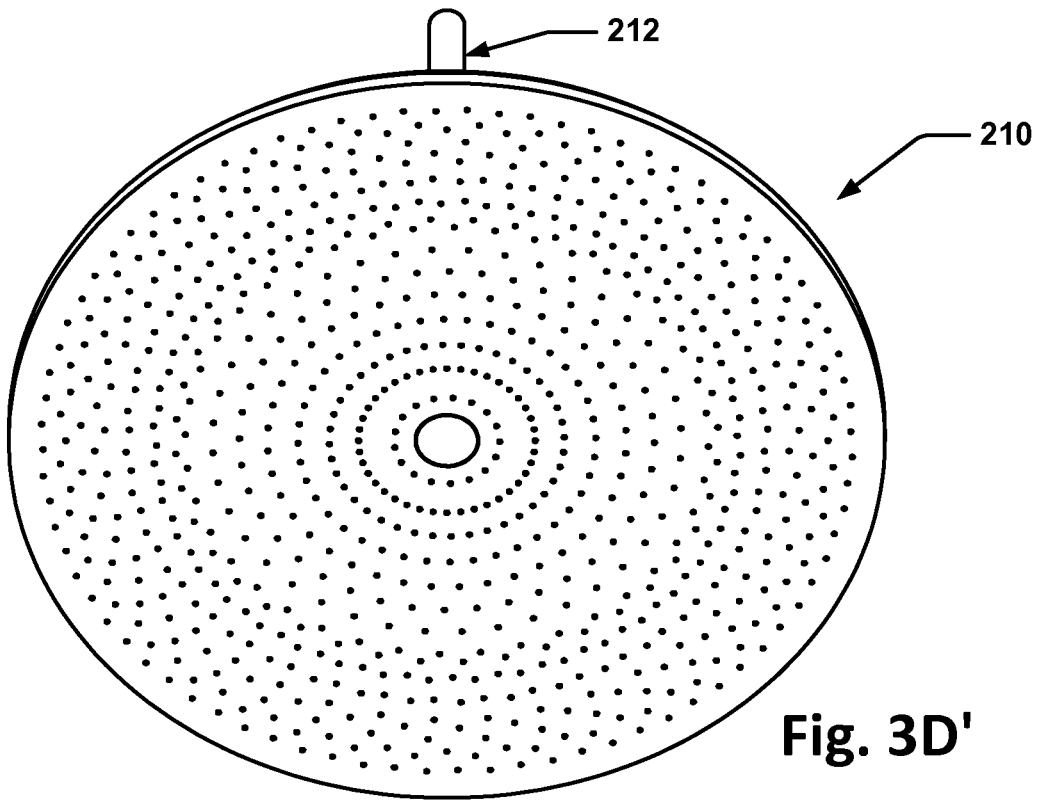

As shown in FIGS. 2A-2E, the gas distribution stem 212 may span between the ceramic faceplate assembly 210 and the gas distribution region of the stem sleeve 220. FIGS. 3D and 3D' depict two isometric views of the ceramic faceplate assembly 210 and the attached gas distribution stem 212. The gas distribution stem 212 may be substantially cylindrical in shape and largely hollow. One end 236 of the gas distribution stem 212 may feature a connection point for attachment of one or more process gas inlet feed lines to allow for gas flow into the hollow region. The gas distribution stem 212 may also feature multiple hole features 224 configured to allow process gas introduced into the hollow region of the gas distribution stem 212 via the one or more process gas inlet feeds to escape into the annular gas flow gap between the stem sleeve 220 and the outer surface of the gas distribution stem 212. Multiple hole features 224 may include holes drilled through the diameter of the gas distribution stem 212, and the centerline of each hole may be orthogonal to the previous hole. The holes may, for example, include 6 through-holes, each through-hole including one hole on each side of the gas distribution stem 212, for a total of 12 holes. Other configurations of stems may be used as well, e.g., a stem sleeve without an internal gas distribution stem.

The gas distribution stem 212 may also include an interface area for interfacing with the ceramic faceplate 214. For example, the gas distribution stem 212 may include a flange or shoulder 248 on one end which is configured to nest inside of a shallow counterbore around center hole of the ceramic faceplate 214 in the face of the ceramic faceplate 214 facing out of the HC showerhead 200. The gas distribution stem 212 may also engage with the sidewall of center hole of the ceramic faceplate 214 in a sliding fit or interference fit.

The gas distribution stem 212 may also include a biasing device, which is configured to counteract potential sagging or warping of the ceramic faceplate 214 due to temperature effects. The biasing device may be a spring, such as spring 201 in FIG. 2A.

The gas distribution stem 212 may also be electrically connected with the ground/power plane 216 to provide an additional or alternate electrically-conductive path from the ceramic faceplate assembly 210 to either ground or a power source.

As mentioned above, the ground/power plane may be embedded within the ceramic faceplate. The embedding, for example, may be accomplished by forming the ceramic faceplate in several stages using machining, sintering, diffusion bonding, and/or brazing processes. FIGS. 4A through 4J depict cross-sectional views of a ceramic faceplate assembly 410 during various phases of manufacture. For convenience, structures which are similar to structures shown in FIGS. 2A through 2F are enumerated with numbers which share the last two digits in common, i.e., the ceramic faceplate 214 in FIGS. 2A through 2F is similar to ceramic faceplate 414 in FIGS. 4A through 4J. This convention is simply for ease of reference of the reader and is not to be viewed as limiting in any way.

Figure 4I:
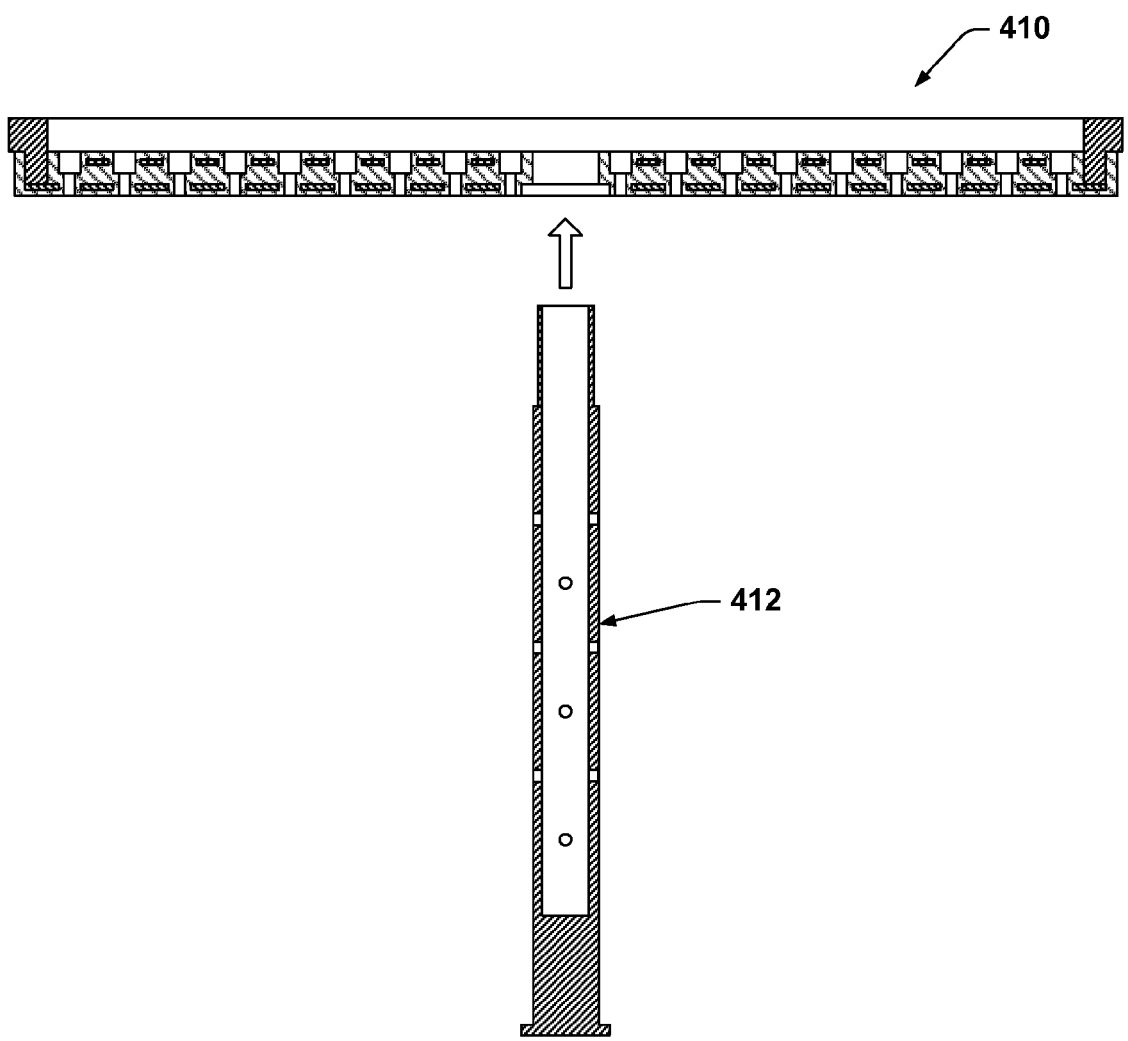

FIG. 4A depicts a cutaway view of the ceramic faceplate assembly 410 after assembly. FIGS. 4B through 4J depict the components shown in FIG. 4A through various stages of manufacture.

Figure 4J:
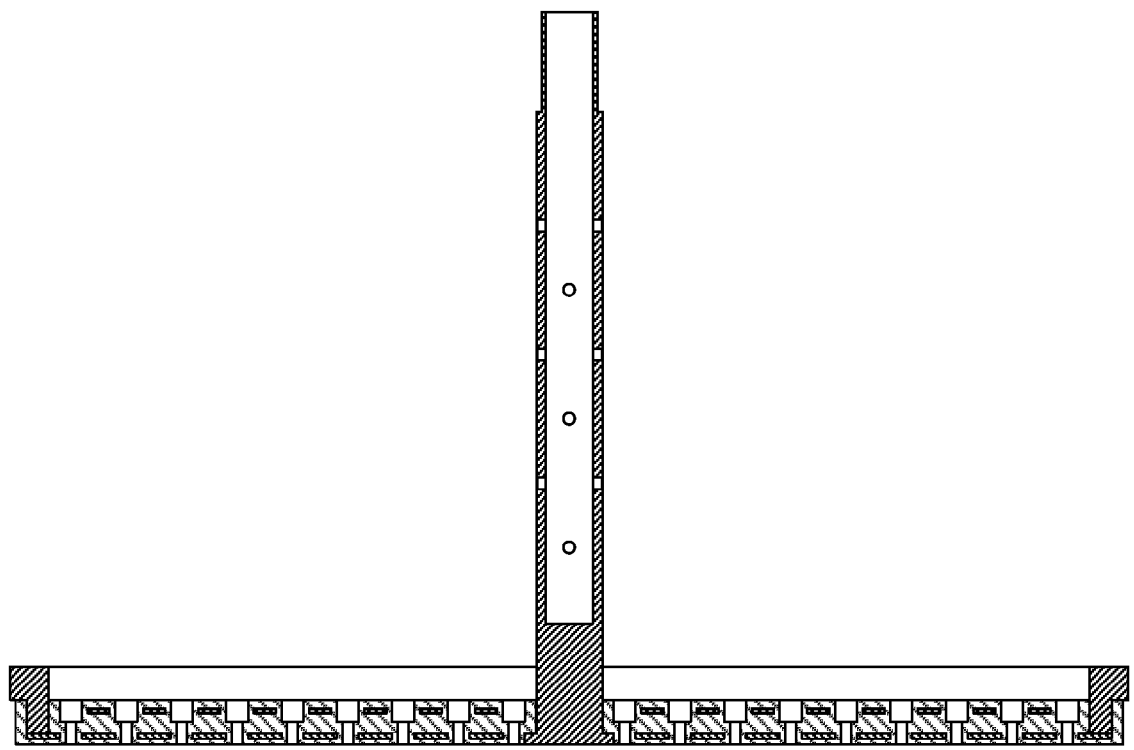

FIG. 4B shows the ceramic faceplate 414 in the early stages of the manufacturing process; ceramic material may be formed into the overall shape of the faceplate, e.g., a disk, along with various gas distribution holes 422 and a central hole for a gas distribution stem (see FIGS. 4I and 4J). The early-stage ceramic faceplate 414 may be formed by isostatically pressing a powdered form of the ceramic material into the desired rough shape, followed by green machining of the rough shape. The green-machined rough shape may then be sintered and finish machined as needed. These processes, or similar processes, may also be used in subsequent processing phases outlined below with respect to a ground/power plane 416 or subsequent forming of the ceramic faceplate 414.

On the top surface of the partially-formed ceramic faceplate 414, a ground/power plane recess 452 may be formed. The ground/power plane recess 452 may, in some implementations, be located such that the top of a ground/power plane 416, i.e., the plane of the ground/power plane 416 furthest from the wafer processing area, is approximately 0.050" from the outer face of the ceramic faceplate 414, i.e., the surface of the ceramic faceplate 414 which is closest to the wafer processing area. Other ground/power plane-faceplate offset distances may be used as well, e.g., distances as close as 0.02" from the face of the ceramic faceplate.

FIG. 4C depicts the ceramic faceplate 414 in the same stage as shown in FIG. 4B, although with the ground/power plane 416 now formed within the ground/power plane recess 452. The ground/power plane 416 may be, for example, 0.002" thick, although other thicknesses are also envisaged.

Subsequent to the embedding of the ground/power plane 416 in the partially-formed ceramic faceplate 414, the ground/power plane 416 may be encapsulated through the addition of additional ceramic material. As shown in FIG. 4D, the ground/power plane 416 may be fully encapsulated by ceramic material except for portions of the ground/power plane 416 which may be exposed via standoff through-holes 446. Gas distribution holes 422 may be formed with varying diameters, as shown in FIG. 4D. The gas distribution holes 422 may also be a single diameter, however. An optional heater recess 454 may be formed in the top surface of the further-formed ceramic faceplate 414. The encapsulation may occur through an additional sintering step which deposits ceramic material over the ground/power plane 416, or may occur through sandwiching the ground/power plane 416 between the partially-formed ceramic faceplate 414 and a corresponding and separately-formed portion of the ceramic faceplate 414 which may then be bonded to the partially-formed ceramic faceplate 414 using diffusion bonding, brazing, or thermal spraying of ceramic material.

FIG. 4E depicts an optional processing step in which material for a resistive heater element 456 may be embedded within the heater recess 454. The heater element 456 is optional and some HC showerheads may not include the heater element 456 or the heater recess 454. The heater element may take the form of a serpentine wire or trace which is laid within or formed on/within a channel or recess in the ceramic faceplate. The heater element may take a circuitous route through the ceramic faceplate. There may also be several heater elements embedded within the faceplate, allowing for separate control. In some implementations, there may be several heater elements embedded within the faceplate which have common endpoints and operate in parallel. The heater element(s) may be made from an electrically-conductive material with sufficient electrical resistance to generate heat when an electrical current passes through the heater element. The heater element may also be made from a material which has a CTE which is similar to that of the ceramic within which it is embedded to avoid thermal expansion issues. Tungsten or molybdenum, for example, may be suitable for use as a heater element material.

The heater elements may be made from a variety of materials, such as electrically-conductive materials with a coefficient of thermal expansion which is very close to that of the ceramic used. Tungsten and molybdenum may, for example, be used for some heater elements.

FIG. 4F shows the ceramic faceplate 414 after receipt of a final layer of ceramic material. Both the ground/power plane 416 and the optional heater element 456 may be, with the possible exception of portions of the conductive contact paths for both, fully encapsulated by the ceramic material of the ceramic faceplate 414. The encapsulation may be implemented in a manner similar to that used to encapsulate the ground/power plane 416. The ceramic faceplate 414 may, for example, be nominally 0.260" inches thick when sintering is complete.

FIG. 4G depicts a contact ring 418 being lowered on top of the ceramic faceplate 414; standoffs 444 may be inserted into standoff through-holes 446 to contact ground/power plane 416. The standoffs 444 may then be bonded to the ground/power plane 416 in regions 458, as shown in FIG. 4H. A gap, e.g., 0.040", may be formed between the bulk of the contact ring 418 and the ceramic faceplate 414 to allow for thermal expansion of the ceramic faceplate 414 without inducing undue stress in the regions 458.

FIG. 4I depicts the insertion of a gas distribution stem 412 into the ceramic faceplate assembly 410. FIG. 4J depicts the fully-assembled ceramic faceplate assembly 410 with the gas distribution stem 412.

The components included in ceramic faceplate assemblies 210 or 410, as well as in other ceramic faceplates discussed herein, may be manufactured from a variety of materials.

Ceramic faceplate 214 or 414 may be manufactured from Aluminum Oxide ($Al_2O_3$) or Aluminum Nitride (AlN), Silicon Nitride ($Si_3N_4$), or Silicon Carbide. Other materials exhibiting strong resistance to attack by fluorine and good dimensional stability at high temperature, i.e., 500-600° C., may be used as well. The particular ceramic used may need to be selected to avoid chemical interactions with the process gases used in particular semiconductor processing applications. Boron Nitride (BN) and Aluminum Oxynitride (AlON) are further examples of ceramics which may be used in this application, although these materials may be challenging to implement due to manufacturing issues.

The ground/power plane 216 or 416, as well as elements of the conductive path to the ground/power plane 216 or 416, may, for example, be manufactured from tungsten or molybdenum. Other electrically-conductive materials with high temperature resistance and with coefficients of thermal expansion similar to that of the ceramic faceplate material may be used. Because the ground/power plane 216 or 416 may be embedded within and protected by the ceramic faceplate 214 or 414, the ground/power plane 216 or 416 need not be made from a material resistant to attack by fluorine. Portions of the conductive path to the ground/power plane 216 or 416 which may not be encapsulated within the ceramic faceplate 214 or 414 may be coated with a protective coating, such as nickel plating, which may prevent or reduce damage to the conductive pathways due to process gas exposure. Other protective coatings may be used as well, such as coatings of noble metals which retain their resistance to corrosion and oxidation at elevated temperatures, e.g., gold, platinum, palladium, or irridium.

The resistive heater element 456 may be manufactured from tungsten or molybdenum, for example. Other electrically-conductive materials with high temperature resistance and with coefficients of thermal expansion similar to that of the ceramic faceplate material may be used. Because the resistive heater element 456 may be embedded within and protected by the ceramic faceplate 214 or 414, the resistive heater element 456 need not be made from a material resistant to attack by fluorine, although portions of the resistive heater element or the conductors leading to it may need to be protected with a protective coating, such as nickel plating, if exposed to process gases. Other protective coatings may be used as well, such as coatings of noble metals which retain their resistance to corrosion and oxidation at elevated temperatures, e.g., gold, platinum, palladium, or iridium.

The contact ring 218 or 418 may be manufactured from tungsten or molybdenum as well; the contact ring 218 or 418 may typically be manufactured from a material which is bond-compatible with the ground/power plane 216 or 416 and which has similar thermal expansion characteristics.

Figure 5A:
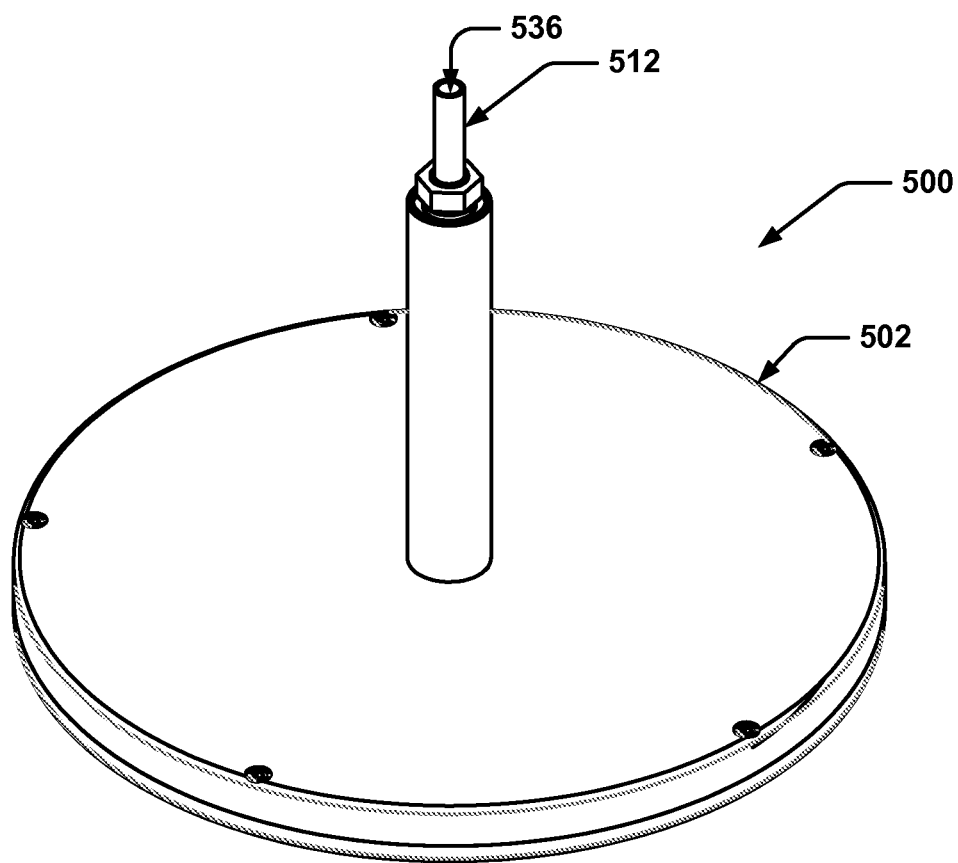
FIG. 5A depicts an isometric view of another implementation of a hybrid ceramic showerhead.

FIGS. 5A through 5G depict another implementation of a HC showerhead. As can be seen in FIG. 5A, a HC showerhead 500 bears an outward similarity to the HC showerhead 200 shown in FIG. 2D. The HC showerhead 500 includes a backplate 502, which is connected to a gas distribution stem 512. An inlet 536 allows process gases to be introduced into the interior of the HC showerhead 500.

Figure 5B:
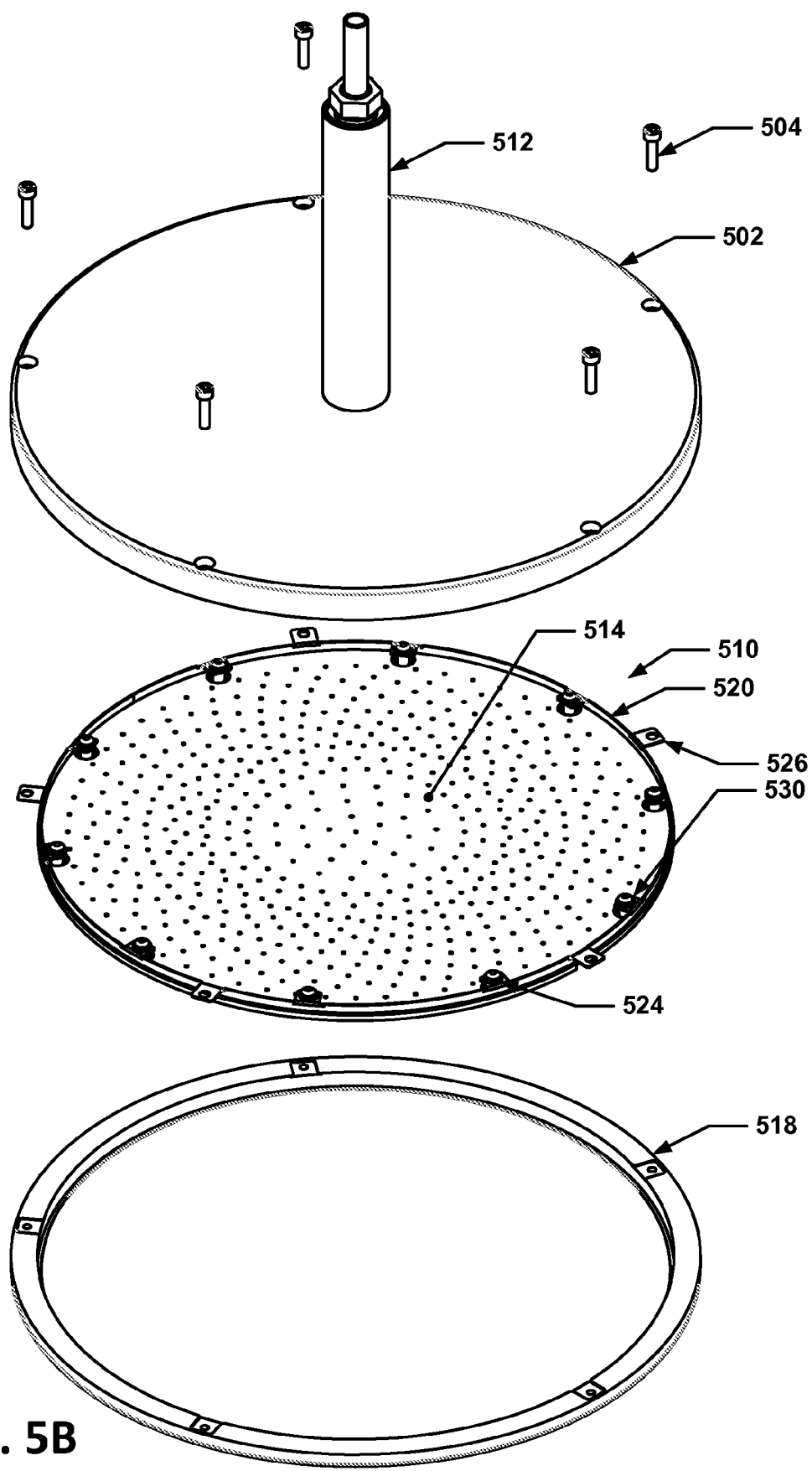
FIG. 5B depicts an isometric exploded view of the implementation shown in FIG. 5A.

FIG. 5B depicts an exploded isometric view of the HC showerhead 500. Removal of backplate screws 504 allows a contact ring 518 to be removed from the backplate 502. A ceramic faceplate assembly 510, which is sandwiched between the backplate 502 and the contact ring 518, may be released after the contact ring 518 is removed. The backplate screws 504 may thread into threaded holes on the contact ring 518. The ceramic faceplate assembly 510 may include an RF collar 520, which may take the general form of a thin-walled hoop which encircles a ceramic faceplate 514 and which is considerably larger in diameter than it is thick (e.g., a diameter on the order of inches/tens of inches, and a thickness on the order of thousandths or hundredths of an inch). In some implementations, the RF collar 520 may be made from one or more segments which are arranged end-to-end to form a nominal hoop shape. For example, the RF collar 520 may be formed from a single strip which is looped into a hoop shape with the two ends of the strip overlapping. In another example, the RF collar 520 may be formed by four shorter strips, the ends of each of which overlap, or come in close proximity to, the ends of neighboring strips. Outer collar tabs 526 may protrude from the RF collar 520 such that the backplate screws 504 pass through holes in the outer collar tabs 526 to secure the outer collar tabs 526 in place when the ceramic faceplate assembly 510 is sandwiched between the contact ring 518 and the backplate 502. This allows the RF collar 520 to be in electrical contact with the backplate 502 via the outer collar tabs 526.

Figure 5C:
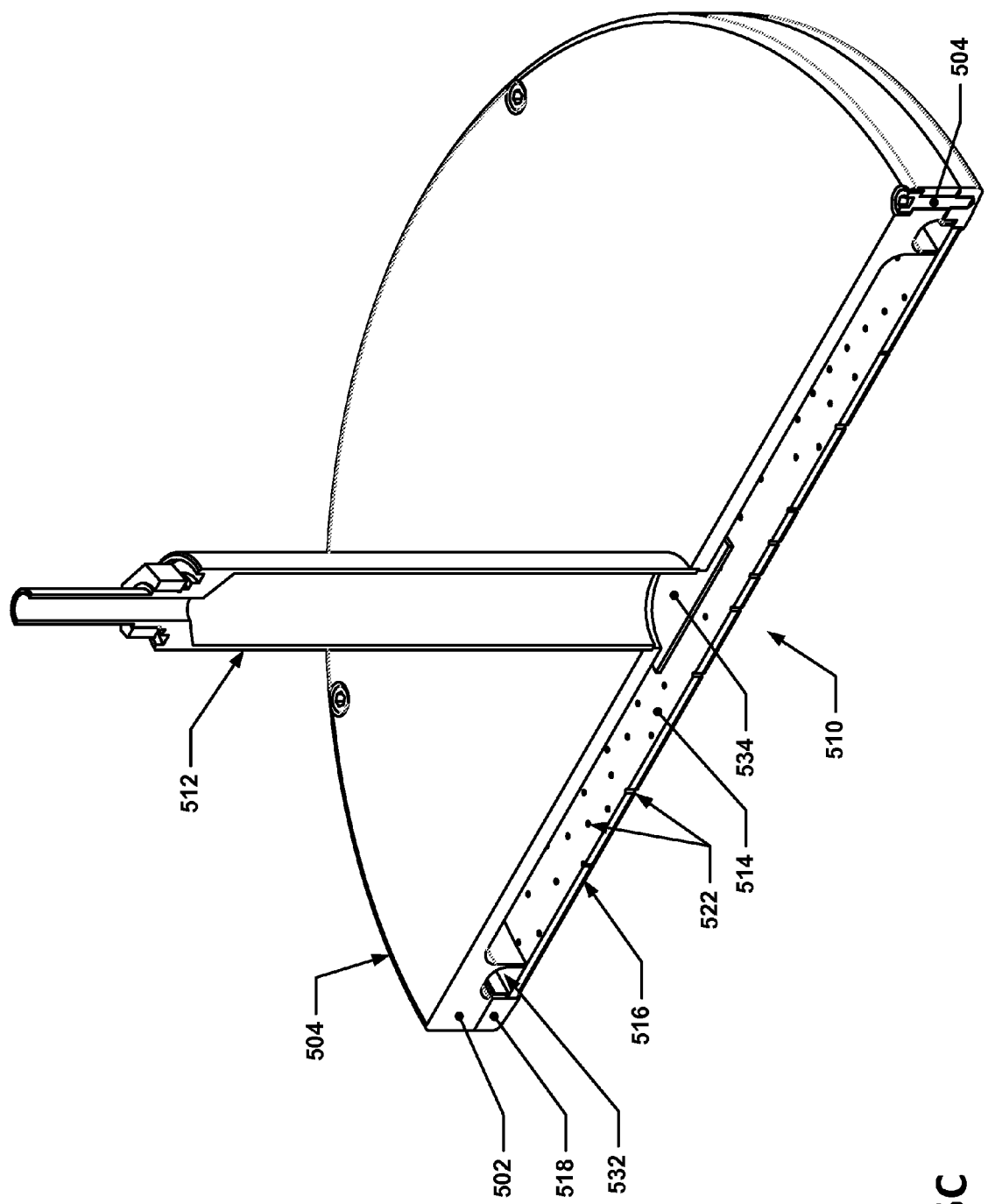
FIG. 5C depicts an isometric cutaway view of the implementation shown in FIG. 5A.

FIG. 5C depicts an isometric cutaway view of the HC showerhead 500. As can be seen, the gas distribution stem 512 is in fluidic communication with the plenum space between the backplate 502 and the ceramic faceplate assembly 510. The backplate 502 may feature an annular groove 532 which runs about the outer circumference of the backplate 502. The annular groove 532 may be sized to clear fasteners (see faceplate screws 524 in FIGS. 5F and 5G) used to attach the RF collar 520 to the ceramic faceplate assembly 510, and may include an inner edge which forms a light, compressive contact with the ceramic faceplate assembly 510. The ceramic faceplate assembly 510 may include the ceramic faceplate 514, which may include an embedded ground/power plane 516. A plurality of gas distribution holes 522 may fluidly connect the plenum with the ambient environment outside the HC showerhead 500.

Figure 5D:
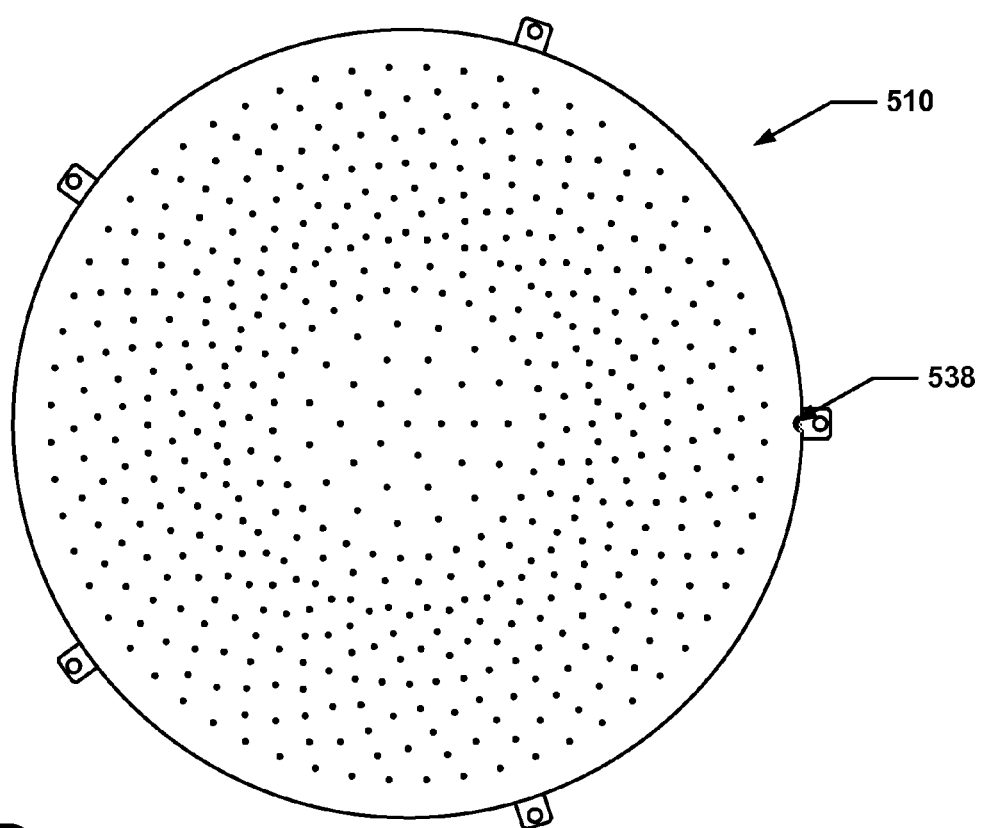
FIGS. 5D and 5E depict bottom and top views, respectively, of a ceramic faceplate assembly of the implementation shown in FIG. 5A.
Figure 5E:
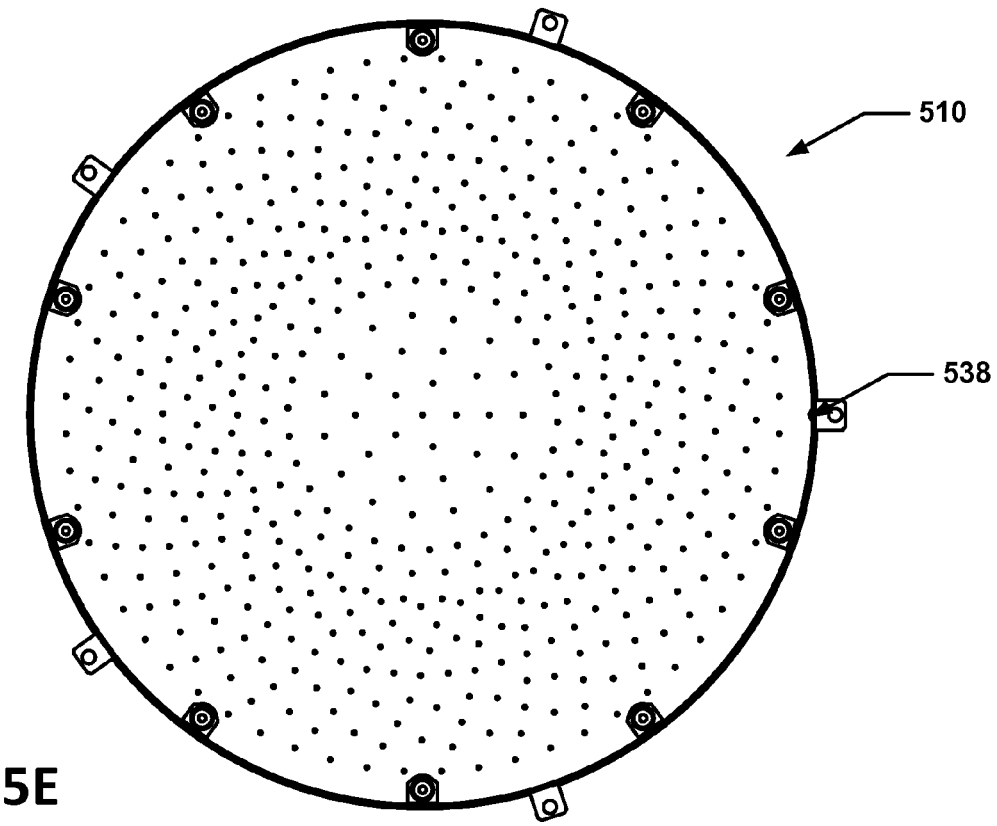

FIGS. 5D and 5E depict bottom and top views, respectively, of the ceramic faceplate assembly 510. In the pictured implementation, the gas distribution holes 522 form a low-density pattern within a zone approximately one third the diameter of the ceramic faceplate assembly 510, and a higher-density pattern in the remaining area of the ceramic faceplate assembly 510. Also visible is indexing feature 538, which may be used to rotationally align the components of the ceramic faceplate assembly 510 during assembly.

Figure 5F:
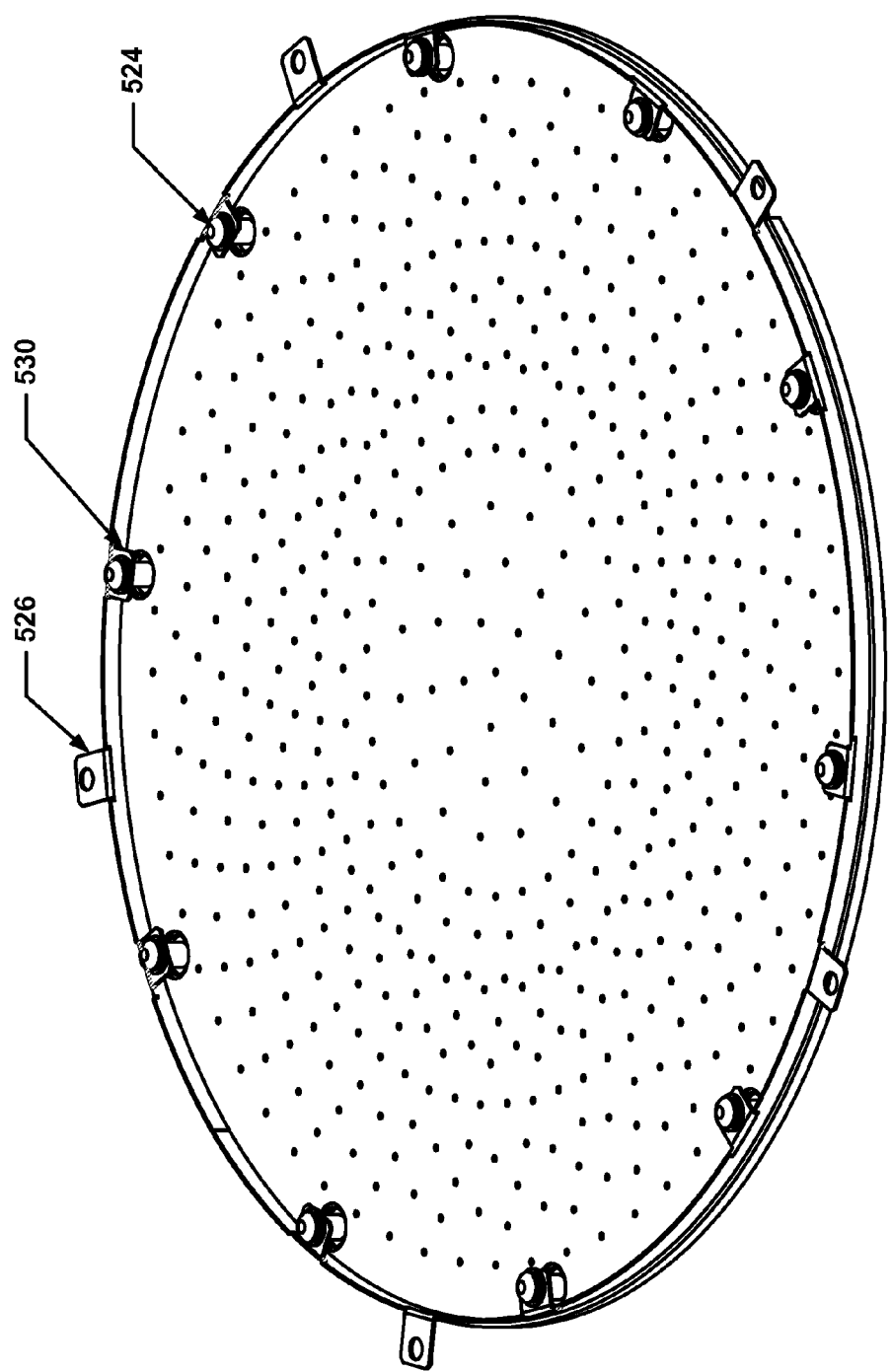
FIG. 5F depicts an isometric view of the ceramic faceplate assembly of FIGS. 5D and 5E.

FIG. 5F depicts an isometric top view of the ceramic faceplate assembly 510. The RF collar 520 allows the ceramic faceplate 514 and the backplate 502 to expand different amounts without inducing significant strain-induced stress. This may allow the HC showerhead 500 to be used in environments with large thermal deltas without risking temperature-induced cracking of the backplate 502 or the ceramic faceplate assembly 510. Thermal expansion mismatches between the backplate 502 and the ceramic faceplate assembly 510 may be accommodated by the RF collar 520, which may be made from, for example, aluminum, titanium, molybdenum, tungsten or other material with low resistivity, permeability, and/or creep (high elasticity) properties. Due to the RF collar 520's thinness, the RF collar 520 may deflect substantially under very little load, allowing the RF collar 520 to flex without inducing significant stress in either the backplate 502 or the ceramic faceplate assembly 510. The inner collar tabs 530 may be placed approximately midway between the outer collar tabs 526, or vice versa, to allow for increased flexure of the RF collar 520. The RF collar 520 may, since it may not be embedded in the ceramic faceplate 514, be coated with a protective coating, such as nickel plating. The RF collar 520 may be attached to the ceramic faceplate assembly 510 using the faceplate screws 524 and the inner collar tabs 530. Other protective coatings may be used as well, such as coatings of noble metals which retain their resistance to corrosion and oxidation at elevated temperatures, e.g., gold, platinum, palladium, or irridium.

Figure 5G:
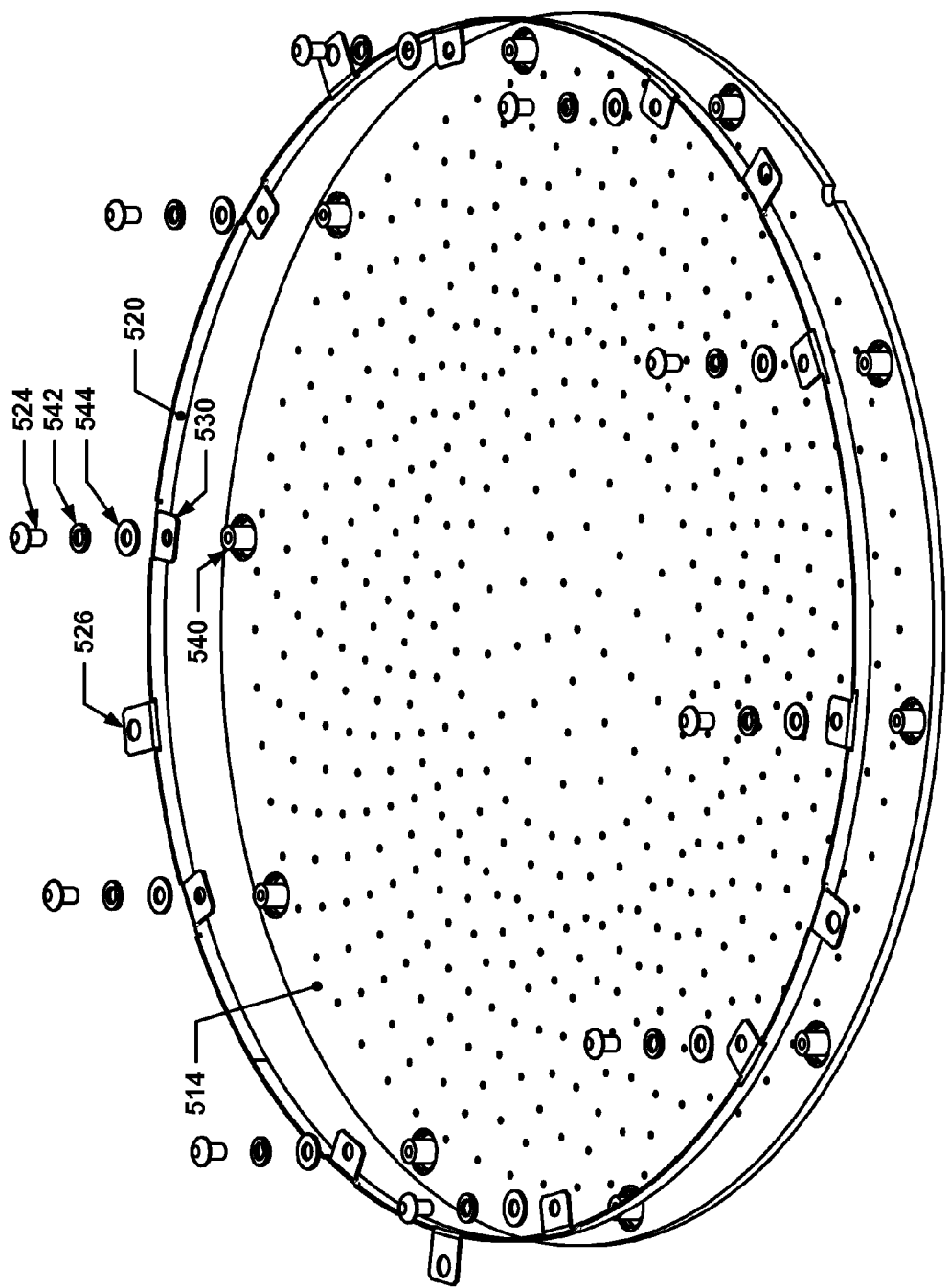
FIG. 5G depicts an isometric exploded view of the ceramic faceplate assembly of FIG. 5F.

FIG. 5G shows an isometric exploded view of the ceramic faceplate assembly 510. The overall shape of the RF collar 520 in this implementation can be seen to be a large, thin-wall hoop or ring, with the inner collar tabs 530 and the outer collar tabs 526 bent to be perpendicular to the hoop central axis. The faceplate screws 524 may be augmented using washers 544 and lock washers 542, if needed.

The ceramic faceplate 514 may include an embedded ground/power plane (not pictured since it is embedded within the ceramic faceplate), similar to the embedded ground/power planes disclosed in this application. A series of conductive standoffs 540 may be in conductive contact with the embedded ground/power plane. The conductive standoffs 540 may be bonded to the embedded ground/power plane, and may be coated with a protective coating, such as nickel plating. Other protective coatings may be used as well, such as coatings of noble metals which retain their resistance to corrosion and oxidation at elevated temperatures, e.g., gold, platinum, palladium, or irridium. The conductive standoffs 540 (as well as other conductive elements connected with the embedded ground/power planes discussed herein) may be bonded to the embedded group/power plane using, for example, a brazed or diffusion-bonded connection. An annular gap may exist between the conductive standoffs 540 and the hole through which the annular standoffs 540 pass. If present, such a gap may be filled with a protective coating material, such as nickel. Other fill materials may be used as well, such as noble metals which retain their resistance to corrosion and oxidation at elevated temperatures, e.g., gold, platinum, palladium, or irridium. In some implementations featuring conductive standoffs 540 which are brazed to the embedded ground/power plane, the gap filler material may be the same as the brazing material which is used. This may seal the conductive standoff/embedded ground/power plane interface and prevent attack of the embedded ground/power plane by process gases. In FIG. 5G, such a protective gap fill is not shown, although the annular gap is visible and the protective gap fill would need to be applied. During LLCE, the ceramic faceplate assembly 510, including the ceramic faceplate 514 and the RF collar 520, may be removed and exchanged for a new unit.

Figure 6:
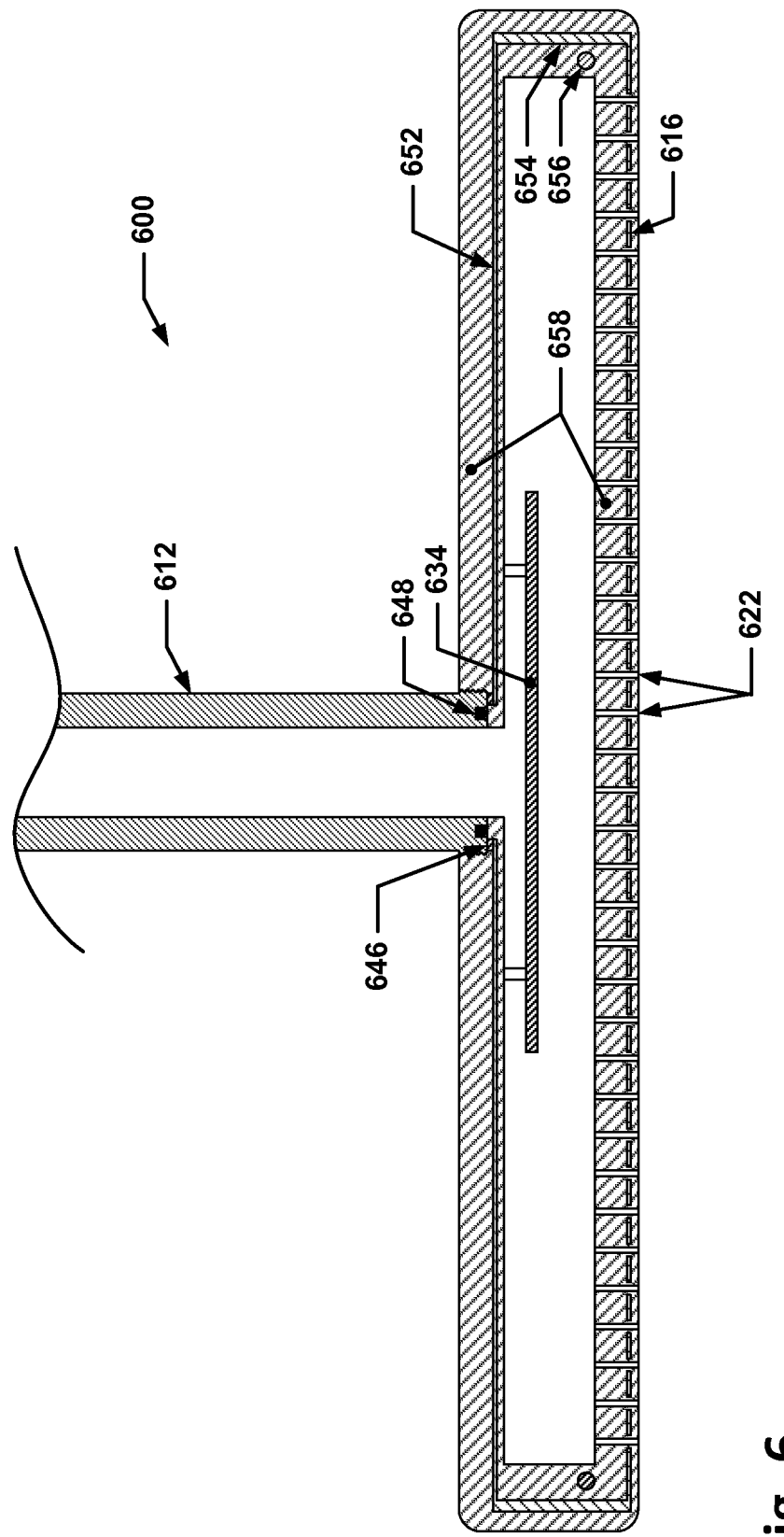
FIG. 6 depicts a conceptual section view of another implementation of a hybrid ceramic showerhead design.

FIG. 6 depicts a simplified cross-sectional view of another implementation of a HC showerhead. HC showerhead 600 features unitary faceplate/backplate 658 which may be made of a ceramic, e.g., alumina. The unitary faceplate/backplate 658 may include structures similar to those discussed above, e.g., the unitary faceplate/backplate 658 may include a faceplate portion, a backplate portion, and an annular outer wall which joins the two portions. Some of these portions may be manufactured as a single piece and then joined to the other portions during manufacturing, e.g., via diffusion bonding. A showerhead plenum volume may be enclosed within the unitary faceplate/backplate 658.

The faceplate portion of the unitary faceplate/backplate 658 may include a pattern of gas distribution holes 622, and feature an embedded ground/power plane 616 embedded within the ceramic, similar to the embedded ground/power planes in the faceplates of other implementations described within this document. A plurality of conductive vias 654 may connect the embedded ground/power plane 616 to a conductive path 652 embedded within the backplate portion of the unitary faceplate/backplate 658. The conductive vias 654 may also be embedded within the ceramic portion of the unitary faceplate/backplate 658.

A gas distribution stem 612 made, for example, from aluminum, may connect with the unitary faceplate/backplate 658. The gas distribution stem 612 may connect to the unitary faceplate/backplate 658 via, for example, a mechanical interface feature such as threaded interface 650. Other mechanical interface features may be used as well, such as a bayonet-type interface. A port, i.e., one or more perforations through the backplate portion of the unitary faceplate/backplate, may provide a fluid flow path from the gas distribution stem 612 to the showerhead plenum volume. The port may be a substantially circular single opening, or may be a group of openings which fit substantially within a nominally circular area. Similar ports may be found in other backplate portions or backplates. An RF gasket 646 may provide for electrical contact between conductive path 652 embedded within unitary faceplate/backplate 658 and the gas distribution stem 612. Power (or ground) applied to the gas distribution stem 612 may thus be transferred to the embedded ground/power plane 616. An o-ring seal 648 may prevent process gases from leaking through the threaded interface 650. A baffle 634, e.g., a circular or near-circular plate, may be situated within the plenum volume of unitary faceplate/backplate 658 and may assist in evenly distributing process gases delivered to the plenum. The baffle plate may be spaced apart from the backplate by a standoff or standoffs. A resistive heater element 656 may be embedded within the unitary faceplate/backplate 658 around the perimeter of the unitary faceplate/backplate 658; such a heater element may be embedded inside or outside of the conductive vias 654. The unitary faceplate/backplate 658 may need to be made from multiple pieces which are then joined together, e.g., via diffusion bonding, to form the finished component. For example, since baffle 634 is too large to fit through the hole in the baseplate portion of unitary faceplate/backplate 658, baffle 634 may be installed before unitary faceplate/backplate 658 is completely assembled. After baffle 634 is installed onto the backplate portion of unitary faceplate/backplate 658, the faceplate portion of unitary faceplate/backplate 658 may be bonded to the backplate portion, sealing the baffle within the unitary faceplate/backplate 658.

HC showerhead 600 may reduce the risk of thermal expansion issues and may provide an enhanced RF transmission path compared to some other HC showerhead designs. For example, due to the fact that the unitary faceplate/backplate 658 and the gas distribution stem 612 join at the threaded interface 650, and the threaded interface 650 is a relatively small diameter, the strain mismatch between the gas distribution stem 612 and the unitary faceplate/backplate 658 due to differing thermal expansion properties (e.g., if unitary faceplate/backplate 658 is made of alumina, and gas distribution stem is made of aluminum) may result in significantly less relative displacement between the two parts, which may reduce thermal stresses significantly and reduce the risk of temperature-induced cracking A component similar to the RF collar 520 may not be needed in such a design since the thermal expansion displacement between the gas distribution stem 612 and the unitary faceplate/backplate 658 may be considerably reduced as compared to an interface located near the outer edge of the unitary faceplate/backplate 658.

Figure 7:
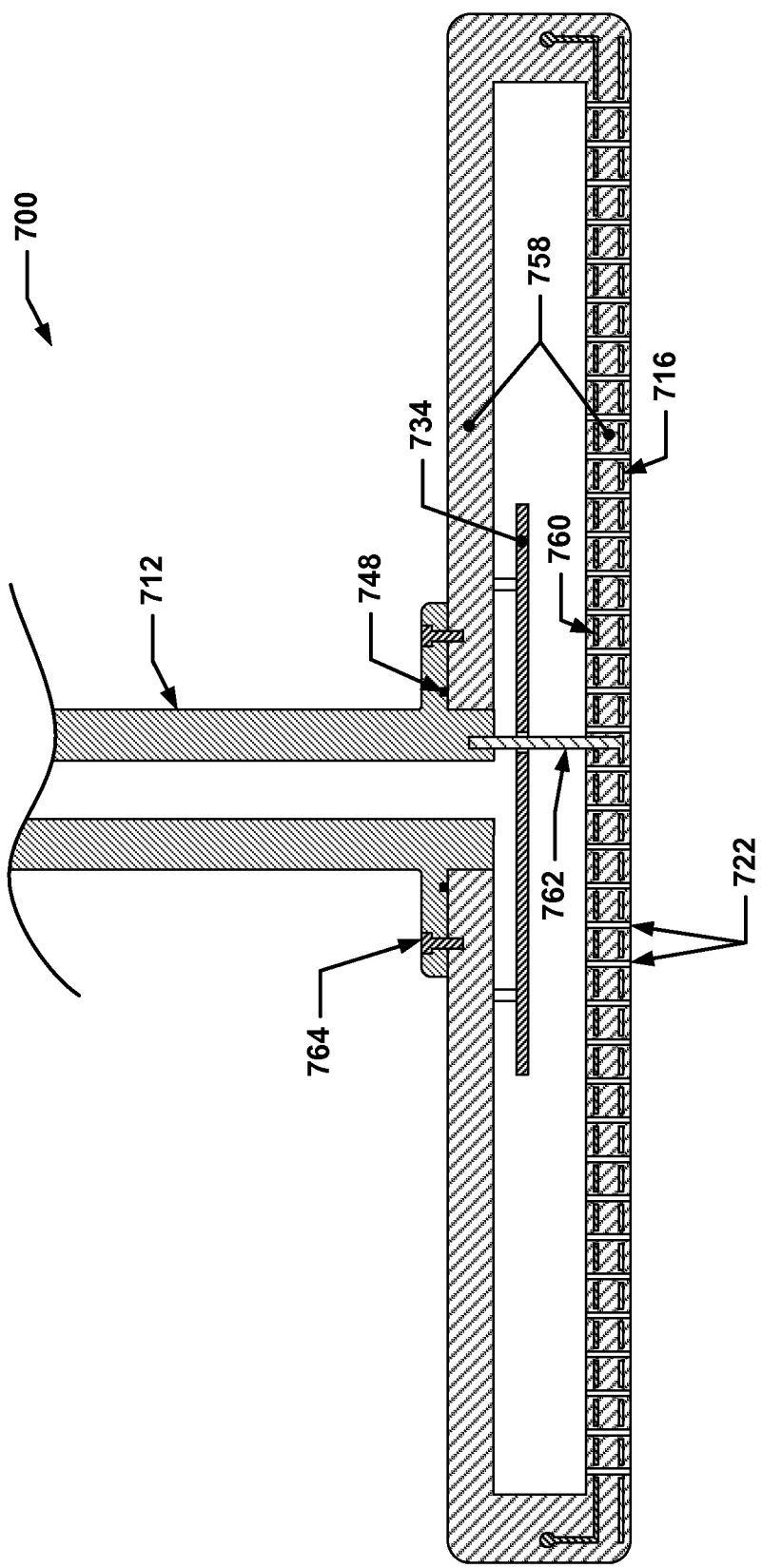
FIG. 7 depicts a conceptual section view of another implementation of a hybrid ceramic showerhead design.

FIG. 7 depicts another HC showerhead featuring a unitary faceplate/backplate. HC showerhead 700 may include a unitary faceplate/backplate 758 which may be similar to the unitary faceplate/backplate 614 shown in FIG. 6. For example, the unitary faceplate/backplate 758 may include a baffle 734 which is configured similarly to the baffle 634 in FIG. 6. In this particular implementation, the unitary faceplate/backplate 758 also includes some additional features (and omits some others) in comparison to unitary faceplate/backplate 614. For example, stem 712 may connect to unitary faceplate/backplate 758 via a flange with a bolt circle. Stem screws 764 may secure stem 712 to the unitary faceplate/backplate 758 via threaded holes in the unitary faceplate/backplate 758. An o-ring seal 748 may be used to prevent process gases delivered to the HC showerhead 700 via the stem 712 from leaking through the flange interface and attacking the stem screws 764.

The faceplate portion of the unitary faceplate/backplate 758 may include a pattern of gas distribution holes 722, as well as an embedded ground/power plane 716, which may be embedded in a manner similar to the other embedded ground/power planes discussed herein. The embedded ground/power plane 716 may be in conductive contact with the stem 712 via RF riser or pin 762, which may be bonded to the embedded ground/power plane 716. The faceplate portion of the unitary faceplate/backplate 758 may also include an embedded heater element 760, similar to the embedded resistive heater element 456 in FIG. 4E.

Figure 8A:
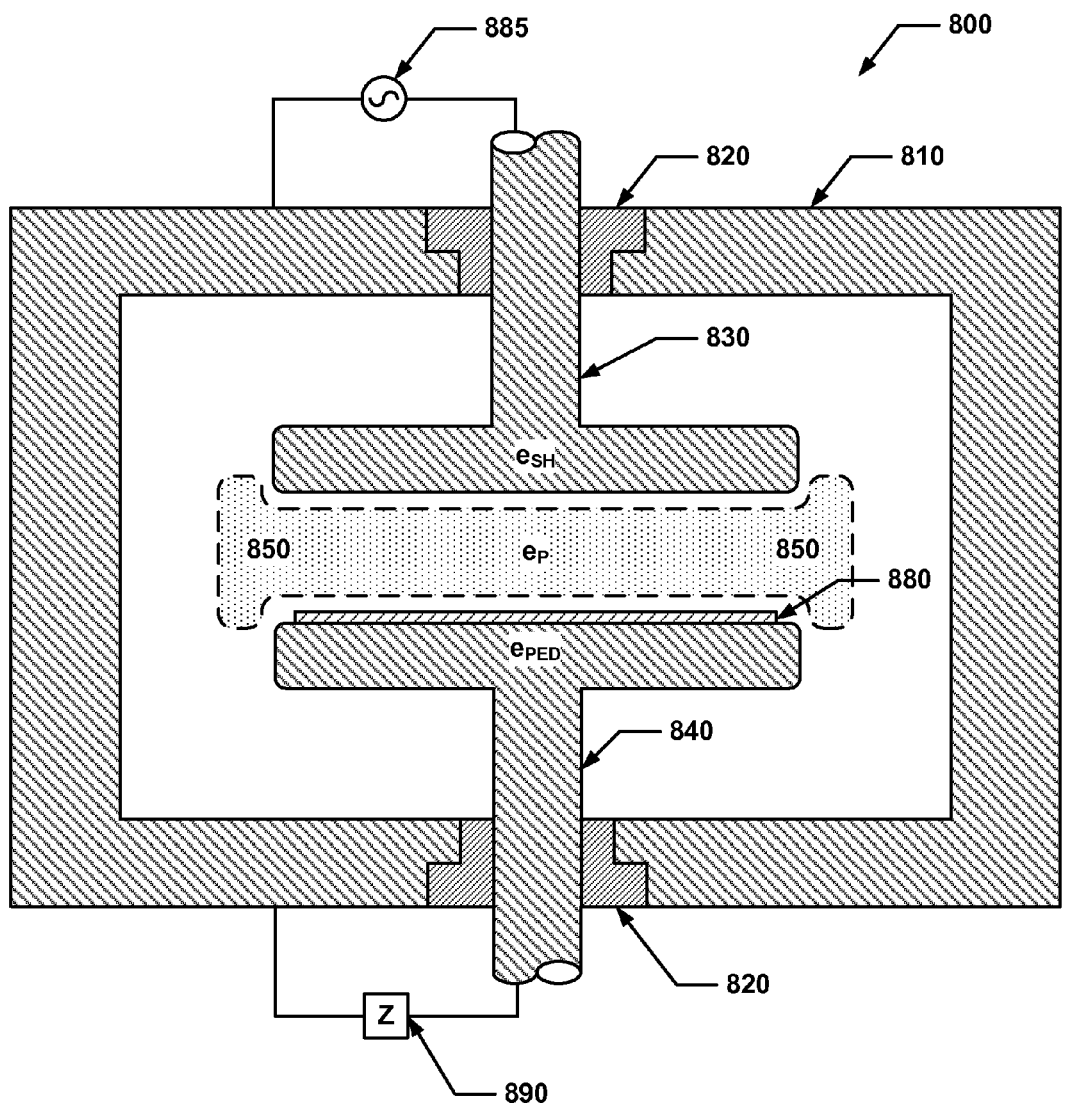
FIGS. 8A-8C depict high-level diagrams of semiconductor processing chambers.
Figure 8B:
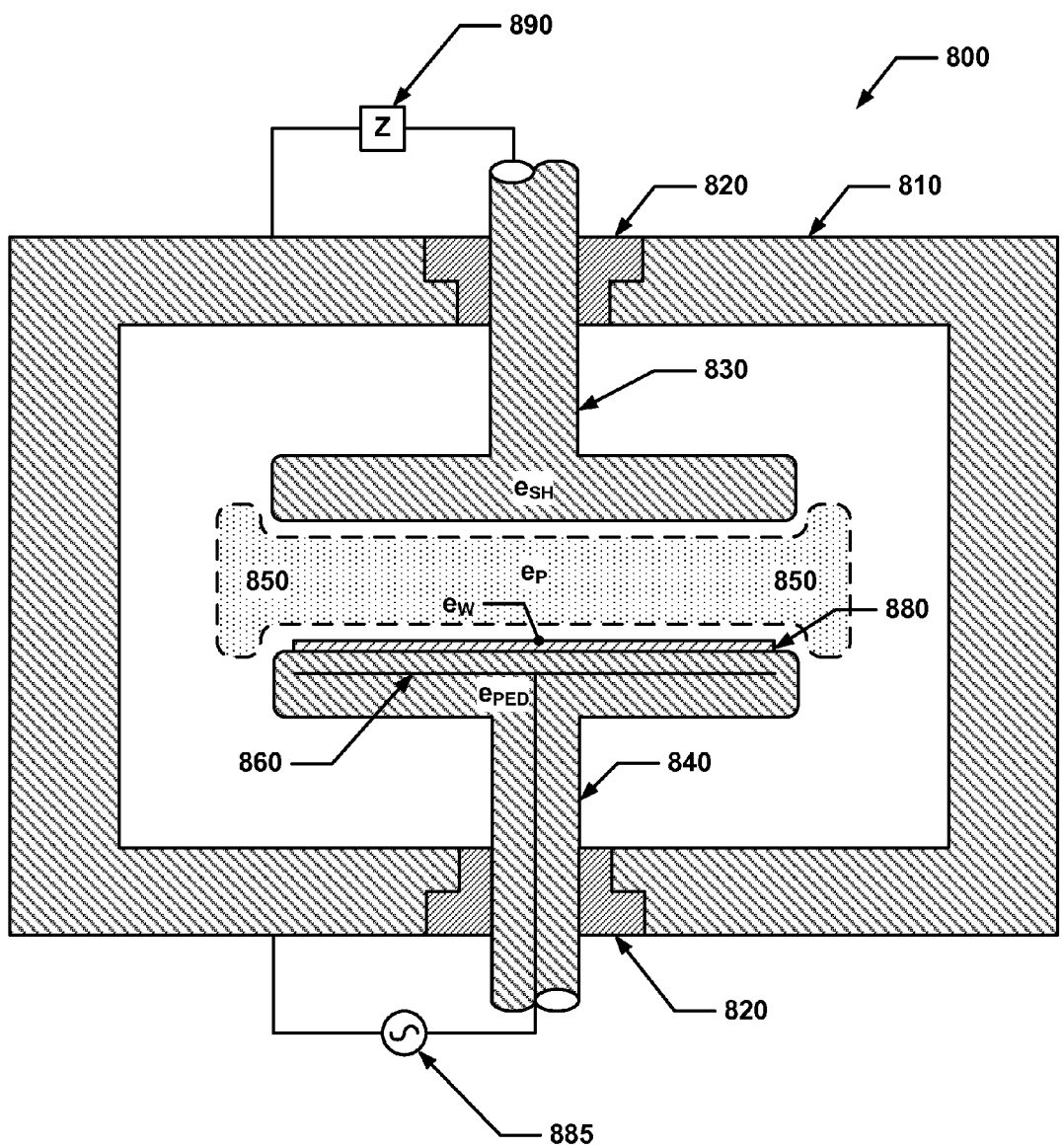
Figure 8C:
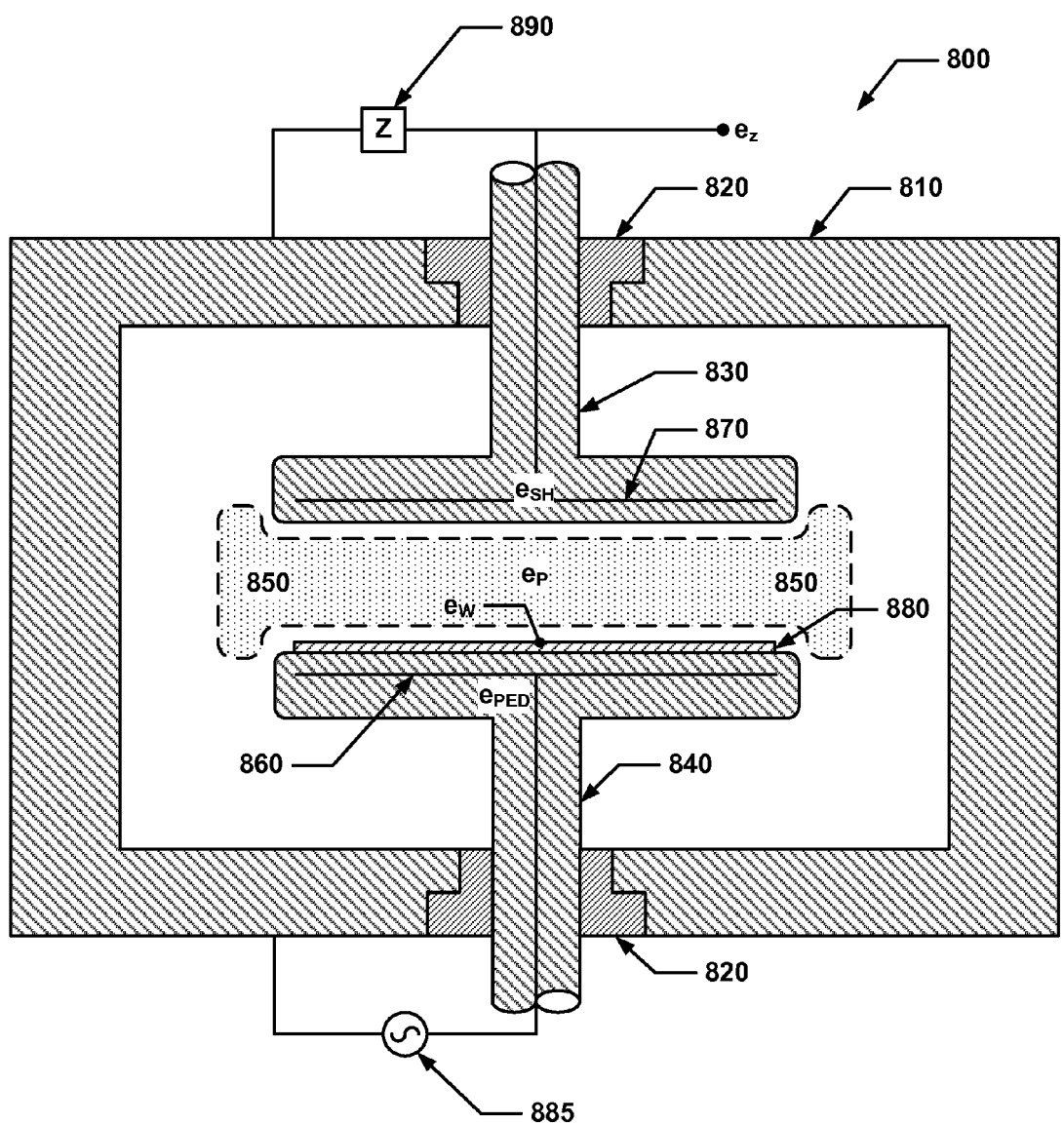

FIGS. 8A through 8C show high-level diagrams of a semiconductor processing apparatus 800. A chamber 810 is equipped with interface(s) 820 which interface with showerhead 830 and pedestal 840. A wafer 880 may be supported by the pedestal 840. FIG. 8A depicts an implementation of the semiconductor processing apparatus which does not utilize an embedded electrode in the showerhead; such an implementation may be representative of many processing apparatuses in current use.

In FIG. 8A, the showerhead 830 may be a standard, non-embedded electrode showerhead, and may be connected with an RF source 885 to form a cathode. The pedestal 840 may act as an anode and be connected with ground impedance 890; the ground impedance 890, for the sake of this discussion, may be zero (although in actual implementations, a non-zero ground impedance value may be used). In such an arrangement, if the RF source 885 provides an $e_{SH}$ of approximately 100V and if the pedestal 840 is kept at an $e_{PED}$ of approximately 5V, plasma potential $e_P$ may be approximately 10V and wafer voltage $e_W$ may be approximately 7V.

In FIG. 8B, the pedestal 840 is connected with the RF source 885 to form a cathode; the pedestal 840 in FIG. 8B may feature an embedded electrode 860. The showerhead 830 may serve as an anode and be connected with ground impedance 890; the ground impedance 890 may, as discussed above, be zero for this discussion. The configuration shown in FIG. 8B may be representative of some current AHM chambers. In such implementations, the plasma 850 may be kept at an $e_P$ of approximately 10V, and the wafer at a potential $e_W$ of −70V, by supplying RF power to the pedestal 840 from RF source 885.

In FIG. 8C, the showerhead 830 is equipped with an embedded electrode 870 (embedded ground/power plane), such as those discussed above in this document. In the pictured configuration, the showerhead 830 serves as an anode and is grounded to the chamber 810 through ground impedance 890. The pedestal 840, as in FIG. 8B, includes the embedded electrode 860, which is connected to RF source 885. In the scenario of FIG. 8C as discussed thus far, the plasma potential $e_P$ is approximately −10V, the wafer potential $e_W$ is approximately −90V. However, if a DC voltage source $e_Z$ is applied to the embedded electrode 870, the plasma potential $e_P$ may shift to approximately 10V, and the wafer potential $e_W$ may shift to approximately −70V. This correlates with the potentials achieved in currently-used equipment such as that shown in FIG. 8B, and allows a HC showerhead to be used in processes which are currently in use without requiring requalification of the processes. A DC voltage source capable of supplying up to about +200V may be used to provide for such biasing for a wide range of chamber geometries and HC showerhead designs. For example, the separation distance between the chamber walls and the HC showerhead may affect the amount of DC voltage bias which may be needed.

FIG. 8D summarizes various voltages at various points in the systems of FIGS. 8A-8C. The first row includes potentials $e_Z$, which correspond to either ground (0) or to the application of a DC voltage source (20). The second row includes potentials $e_P$, which correspond to plasma potentials. The third row includes the potential $e_W$ at the wafer, and the fourth row lists the plasma/wafer potential difference $e_P$-$e_W$. As can be seen adding a DC voltage to the showerhead electrode as shown in FIG. 8C causes the process electric potential conditions (from the wafer/plasma perspective) to largely mirror those produced using the apparatus of FIG. 8B. Further discussion of the interaction of electrodes and plasmas in a semiconductor processing chamber may be found, for example, in B. Chapman, "GLOW DISCHARGE PROCESSES: SPUTTERING AND PLASMA ETCHING," 162, (John Wiley & Sons, 1980); H. R. Koenig and L. I. Maissel, "APPLICATION OF RF DISCHARGES TO SPUTTERING," 14 IBM Journal of Research Development 168 (1970); and J. W. Coburn and Eric Kay, 43 Journal of Applied Physics 4965 (1972), which are hereby incorporated by reference in their entirety.

Because the ceramic faceplate assembly (or the unitary faceplate/backplate in some implementations) in a HC showerhead is removable as opposed to being a sealed, e.g., completely welded, unit, the interior spaces of the HC showerhead may be accessed for cleaning.

During a cleaning operation, the HC showerhead may be removed from a tool and the ceramic faceplate removed. Particulate matter may be easily removed from the internal volumes of the showerhead once the ceramic faceplate is removed. The ceramic faceplate itself may be ultrasonically cleaned. The showerhead itself may theoretically be reused an infinite number of times, although the ceramic faceplate assembly may need to be replaced periodically.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper. Further, the disclosed methods may be implemented in a process with lithography and/or patterning processes preceding or following the disclosed methods.

In some implementations, the HC showerhead may be installed in a reactor and linked to a system controller having instructions for controlling process operations. The system controller will typically include one or more memory devices and one or more processors configured to execute the instructions so that the apparatus will perform various semiconductor fabrication processes. Machine-readable media containing instructions for controlling process operations may be coupled to the system controller. The processors may include a CPU or computer and may include or be communicatively connected with one or more analog and/or digital input/output connections, stepper motor controller boards, etc. The system controller, for example, may be configured to control gas delivery to the showerhead, pedestal movement, vacuum port suction to evacuate gas from the reactor, power and frequency to the plasma electrodes, and/or heating and cooling elements, if present in a particular implementation.

Typically there will be a user interface associated with the system controller. The user interface may include a display screen, graphical software displays of the apparatus and/or process conditions, and user input devices such as pointing devices, keyboards, touch screens, microphones, etc. The system controller may be connected to any or all of the components shown in of a tool or module, including those shown in the Figures of this application; the system controller's placement and connectivity may vary based on the particular implementation.

In certain implementations, the system controller controls the pressure in the processing chambers. The system controller may also control the concentration of various process gases in the chamber by regulating valves, liquid delivery controllers, and MFCs in the delivery system as well as flow restriction valves in an exhaust line. The system controller executes system control software including sets of instructions for controlling the timing, flow rates of gases and liquids, chamber pressure, chamber/showerhead/pedestal/substrate temperature, and/or other parameters of a particular process, e.g. electrode RF and DC voltages. Other computer programs stored on memory devices associated with the controller may be employed in some implementations. In certain implementations, the system controller controls the transfer of a substrate into and out of the various apparatuses shown in the figures.

The computer program code for controlling the processes in a process sequence can be written in any conventional computer readable programming language: for example, assembly language, C, C++, Pascal, Fortran or others. Compiled object code or script is executed by the processor to perform the tasks identified in the program. The system software may be designed or configured in many different ways. For example, various chamber component subroutines or control objects may be written to control operation of the chamber components necessary to carry out the described processes. Examples of programs or sections of programs for this purpose include process gas control code, pressure control code, and plasma control code.

The controller parameters relate to process conditions such as, for example, timing of each operation, pressure inside the chamber, substrate temperature, process gas flow rates, RF power, as well as others described above. These parameters are provided to the user in the form of a recipe, and may be entered utilizing the user interface. Signals for monitoring the process may be provided by analog and/or digital input connections of the system controller. The signals for controlling the process are output on the analog and digital output connections of the apparatus.

Although several implementations of this invention have been described in detail herein with reference to the accompanying drawings, it is to be understood that the invention is not limited to these precise implementations, and that various changes and modifications may be effected therein by one skilled in the art without departing from the scope of spirit of the invention as defined in the appended claims.

What is claimed is:

1. A gas distributor comprising:
    a ceramic faceplate for a substrate processing showerhead of a processing chamber, the ceramic faceplate including a first pattern of first through-holes;
    an electrode including a second pattern of second through-holes; and
    a contact ring having one or more standoffs, wherein the contact ring and the one or more standoffs are all electrically conductive and electroconductively coupled with one another, wherein:
        the electrode is embedded within the ceramic faceplate,
        the second pattern matches the first pattern,
        the first pattern includes all of the holes through which processing gases flow through the ceramic faceplate when the ceramic faceplate is installed in the substrate processing showerhead of the processing chamber,
        each second through-hole is larger in size than the corresponding first through-hole,
        the contact ring encircles the first pattern of first through-holes,
        the ceramic faceplate includes one or more blind standoff apertures that terminate at the electrode,
        each standoff extends into a respective blind standoff aperture and is in electrically conductive contact with the electrode, and
        the electrode forms either an anode or a cathode of an RF plasma generation system when the ceramic faceplate is installed in the substrate processing showerhead of the processing chamber.

2. The gas distributor of claim 1, wherein the ceramic faceplate is configured to be removable from the substrate processing showerhead without requiring removal of the substrate processing showerhead from the processing chamber.

3. The gas distributor of claim 1, wherein each second through-hole has a diameter that is at least the larger of:
    the diameter of the corresponding first through-hole plus 0.04", and
    twice the diameter of the corresponding first through-hole.

4. The gas distributor of claim 1, wherein the first through-holes have diameters of approximately 0.05".

5. The gas distributor of claim 1, wherein the first through-holes have diameters of between 0.02" to 0.06".

6. The gas distributor of claim 1, wherein the electrode is embedded within the ceramic faceplate at a depth of approximately 0.05" from a face of the ceramic faceplate which faces away from an interior plenum volume of the substrate processing showerhead when the ceramic faceplate is installed in the substrate processing showerhead.

7. The gas distributor of claim 1, wherein the electrode is approximately 0.002" thick.

8. The gas distributor of claim 1, wherein the electrode is fully encased by ceramic material of the ceramic faceplate with the exception of one or more electrical contact patches located on a side of the electrode which faces towards an interior plenum volume of the substrate processing showerhead when the ceramic faceplate is installed in the substrate processing showerhead.

9. The gas distributor of claim 8, further comprising one or more electrically-conductive pathways, wherein:
    the one or more electrically-conductive pathways includes at least the contact ring, and
    at least a portion of the electrically-conductive pathways is exposed to provide an electrically-conductive contact interface with an electrode power or ground source of the substrate processing showerhead.

10. The gas distributor of claim 9, further comprising a DC voltage source, the DC voltage source electrically connected to the electrically-conductive contact interface.

11. The gas distributor of claim 10, wherein the DC voltage source is configured to supply one or more DC voltages between 0 and 200 volts.

12. The gas distributor of claim 1, further comprising a backplate, wherein:
    the backplate is part of the substrate processing showerhead,
    the backplate is configured to mechanically interface with the contact ring,
    the backplate is configured to mechanically interface with a gas distribution stem or stem sleeve of the substrate processing showerhead, and
    the backplate forms an electrically-conductive pathway from the contact ring to the gas distribution stem or stem sleeve.

13. The gas distributor of claim 1, wherein:
    the ceramic faceplate includes a mechanical interface located near the center of the ceramic faceplate and configured to mate with a complementary mechanical interface of a gas distribution stem of the substrate processing showerhead, and
    when the ceramic faceplate is installed in the substrate processing showerhead, the mechanical interface and the complementary mechanical interface are mated together and the gas distribution stem, via the mated mechanical interface and complementary mechanical interface, supports the center of the ceramic faceplate.

14. The gas distributor of claim 13, further comprising the gas distribution stem and a gas distribution stem sleeve, wherein:
    the gas distribution stem is mated with the gas distribution stem sleeve via a sliding interface,
    the sliding interface includes a spring which constrains sliding movement of the gas distribution stem with respect to the gas distribution stem sleeve,
    the gas distribution stem sleeve and the ceramic faceplate are substantially fixed in space relative to each other and with respect to movement along the sliding interface direction of travel, and the amount of support provided to the center of the ceramic faceplate is governed by displacement of the spring.

15. The gas distributor of claim 1, wherein:
the contact ring includes interface features which are configured to rigidly connect the contact ring with a substrate processing showerhead, and
the one or more standoffs support the contact ring with respect to the ceramic faceplate and vice-versa.

16. The gas distributor of claim 15, wherein the interface features are selected from the group consisting of: a threaded interface formed about a circumference of the contact ring, a bayonet mount formed about the circumference of the contact ring, and a pattern of threaded fastener features spaced about the circumference of the contact ring.

17. The gas distributor of claim 1, further comprising an RF collar, wherein the RF collar is made of an electrically-conductive material and includes:
a thin-walled hoop of a larger diameter than the ceramic faceplate and a smaller diameter than an interior diameter of the contact ring;
a plurality of inner collar tabs, each inner collar tab:
protruding from the thin-walled hoop towards the ceramic faceplate,
overlapping with the ceramic faceplate, and
substantially parallel to a plane normal to a central axis of the thin-walled hoop; and
a plurality of outer collar tabs, each outer collar tab:
protruding from the thin-walled hoop away from the ceramic faceplate,
overlapping with the contact ring, and
substantially parallel to the plane normal to the central axis of the thin-walled hoop.

18. The gas distributor of claim 17, wherein the thin-walled hoop is formed from one or more segments arranged end-to-end to form an overall hoop shape.

19. The gas distributor of claim 17, wherein each outer collar tab is located approximately halfway between neighboring pairs of inner collar tabs about the RF collar's circumference.

20. The gas distributor of claim 17, wherein each inner collar tab is located approximately halfway between neighboring pairs of outer collar tabs about the RF collar's circumference.

21. The gas distributor of claim 1, further comprising at least one heater element, wherein the at least one heater element:
is embedded within the ceramic faceplate,
is not in electrical contact with the electrode,
follows a path which does not intersect any of the first through-holes, and
maintains a minimum distance from each first through-hole of at least the larger of 0.04" and the radius of the first through-hole.

22. The gas distributor of claim 1, further comprising a heater element embedded within the ceramic faceplate, the heater element substantially encircling the first pattern of first through-holes and located in close proximity to an outermost nominal diameter of the ceramic faceplate.

23. The gas distributor of claim 1, further comprising:
the processing chamber;
the substrate processing showerhead;
and
a pedestal, wherein the substrate processing showerhead, the ceramic faceplate, and the pedestal are located substantially within the processing chamber.

24. The gas distributor of claim 23, further comprising a gas distribution stem with a first end and a second end, wherein:
the first end is opposite the second end on the gas distribution stem,
the first end of the gas distribution stem is connected with a top of the processing chamber,
the second end of the gas distribution stem is connected to the substrate processing showerhead, and
the ceramic faceplate is removable from the substrate processing showerhead without removing the gas distribution stem from the top of the processing chamber.

* * * * *